(12) United States Patent
Abesingha et al.

(10) Patent No.: US 10,147,740 B2
(45) Date of Patent: Dec. 4, 2018

(54) METHODS AND STRUCTURES FOR REDUCING BACK GATE EFFECT IN A SEMICONDUCTOR DEVICE

(71) Applicant: pSemi Corporation, San Diego, CA (US)

(72) Inventors: Buddhika Abesingha, Escondido, CA (US); Simon Edward Willard, Irvine, CA (US); Alain Duvallet, San Diego, CA (US); Merlin Green, San Diego, CA (US); Sivakumar Kumarasamy, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/799,983

(22) Filed: Oct. 31, 2017

(65) Prior Publication Data
US 2018/0211972 A1    Jul. 26, 2018

Related U.S. Application Data

(62) Division of application No. 15/385,618, filed on Dec. 20, 2016, now Pat. No. 9,847,348.

(51) Int. Cl.
| | | |
|---|---|---|
| *H01L 27/12* | (2006.01) | |
| *H01L 21/84* | (2006.01) | |
| *H01L 21/66* | (2006.01) | |
| *H01L 23/538* | (2006.01) | |
| *H01L 21/74* | (2006.01) | |

(52) U.S. Cl.
CPC ........ *H01L 27/1203* (2013.01); *H01L 21/743* (2013.01); *H01L 21/84* (2013.01); *H01L 22/12* (2013.01); *H01L 23/5386* (2013.01)

(58) Field of Classification Search
CPC .................. H01L 27/1203; H01L 23/5386
See application file for complete search history.

(56) References Cited

U.S. PATENT DOCUMENTS

| | | |
|---|---|---|
| 6,130,458 A | 10/2000 | Takagi et al. |
| 9,472,512 B1 | 10/2016 | Toh et al. |
| 9,484,897 B2 | 11/2016 | Green et al. |

(Continued)

FOREIGN PATENT DOCUMENTS

| | | |
|---|---|---|
| WO | 2018118224 | 6/2018 |

OTHER PUBLICATIONS

Le, Dung Anh, Office Action received from the USPTO dated Jun. 30, 2017 for U.S. Appl. No. 15/385,618, 9 pgs.

(Continued)

*Primary Examiner* — Dung Le
(74) *Attorney, Agent, or Firm* — Jaquez Land Greenhaus LLP; Martin J. Jaquez, Esq.; Alessandro Steinfl, Esq.

(57) ABSTRACT

Methods and structures for mitigating back gate effects in high voltage and low voltage semiconductor devices of a same integrated circuit fabricated in a silicon-on-insulator technology are described. According to one aspect, one or more resistive couplings are used to control surface potentials at regions of a substrate used for the SOI fabrication proximate the high voltage and low voltage semiconductor devices. According to another aspect, an N-type implant that is biased through a resistive coupling is used to provide a high potential differential with respect to a substrate potential.

8 Claims, 14 Drawing Sheets

(56) References Cited

U.S. PATENT DOCUMENTS

| | | |
|---|---|---|
| 9,837,412 B2 | 12/2017 | Tasbas et al. |
| 9,847,348 B1 | 12/2017 | Abesingha et al. |
| 2002/0125921 A1 | 9/2002 | Van Wershoven |
| 2004/0129977 A1 | 7/2004 | Ohkubo et al. |
| 2009/0283854 A1 | 11/2009 | Levy et al. |
| 2010/0244934 A1 | 9/2010 | Botula et al. |
| 2011/0278581 A1 | 11/2011 | Inoue |
| 2012/0313173 A1* | 12/2012 | Dickey ............... H01L 27/1203 257/347 |
| 2014/0191322 A1 | 7/2014 | Botula et al. |
| 2015/0206964 A1 | 7/2015 | Cheng et al. |
| 2016/0035899 A1 | 2/2016 | Stulemeijer et al. |
| 2016/0141228 A1* | 5/2016 | Leobandung ......... H01L 23/481 257/621 |
| 2016/0190231 A1 | 6/2016 | Ishimaru et al. |
| 2016/0336344 A1 | 11/2016 | Mason et al. |
| 2017/0170177 A1 | 6/2017 | Tasbas et al. |
| 2018/0158822 A1 | 6/2018 | Tasbas et al. |
| 2018/0175841 A1 | 6/2018 | Abesingha et al. |

OTHER PUBLICATIONS

Le, Dung Anh, Notice of Allowance received from the USPTO dated Sep. 5, 2017 for U.S. Appl. No. 15/385,618, 31 pgs.

Abesingha, et al., Response filed in the USPTO dated Jul. 31, 2017 for U.S. Appl. No. 15/385,618, 9 pgs.

Hoffmann, Niels, Written Opinion received from the EPO dated Nov. 27, 2018 for appln. No. PCT/US2016/054982, 9 pgs.

Botula, et al., "A Thin-film SOI 180nm CMOS RF Switch Technology", IBM Microelectronics, IEEE 2009, 9 pgs.

Kerr, et al., "Identification of RF Harmonic Distortion on Si Substrates and its Reduction using a Trap-Rich Layer", IEEE 2008, pp. 151-154.

Sekar, et al., "Comparison of Substrate Effects in Sapphire, Trap-Rich and High Resistivity Silicon Substrates for RF-SOI Applications", IEEE 2015, pp. 37-39.

Neve, et al., "RF and Linear Performance of Commercial 200 mm trap-rich HR-SOI Wafers for SoC Applications", IEEE 2013, pp. 15-17.

Peregrine Semiconductor Corporation, Response filed in the EPO dated Dec. 29, 2017 for appln. No. PCT/US2016/054982, 17 pgs.

Luu, Chuong A., Office Action received from the USPTO dated Feb. 9, 2018 for U.S. Appl. No. 15/600,588, 15 pgs.

Inoussa, Mouloucoulay, Office Action received from the USPTO dated Aug. 30, 2018 for U.S. Appl. No. 15/824,990, 21 pgs.

Morena Enrico, International Search Report and Written Opinion received from the EPO dated Mar. 20, 2018 for appln. No. PCT/US2017/059106, 10 pgs.

Inoussa, Mouloucoulay, Office Action received from the USPTO dated Mar. 26, 2018 for U.S. Appl. No. 15/488,367, 21 pgs.

Hoffmann, Niels, International Preliminary Report on Patentability received from the EPO dated Mar. 29, 2018 for appln. No. PCT/US2016/054982, 20 pgs.

pSEMI Corporation, Response filed in the USPTO dated May 3, 2018 for U.S. Appl. No. 15/488,367, 16 pgs.

Mouloucoulay, Inoussa, Office Action received from the USPTO dated May 29, 2018 for U.S. Appl. No. 15/824,990, 7 pgs.

PSEMI Corporation, Reponse filed in the USPTO dated Jul. 20, 2018 for U.S. Appl. No. 15/824,990, 6 pgs.

Retebo, Metasebia T., Office Action receied from the USPTO dated Oct. 18, 2018 for U.S. Appl. No. 15/600,579, 6 pgs.

* cited by examiner

METHODS AND STRUCTURES FOR REDUCING BACK GATE EFFECT IN A SEMICONDUCTOR DEVICE

CROSS REFERENCE TO RELATED APPLICATIONS—CLAIM OF PRIORITY

The present application may be related to U.S. application Ser. No. 14/661,848, now U.S. Pat. No. 9,484,897 issued on Nov. 1, 2016, entitled "Level Shifter", filed on Mar. 18, 2015 which is herein incorporated by reference in its entirety. The present application may also be related to U.S. application Ser. No. 14/964,412, now U.S. Pat. No. 9,837,412 issued on Dec. 5, 2017, entitled "S-Contact for SOI", filed on Dec. 9, 2015 which is herein incorporated by reference in its entirety.

BACKGROUND

Technical Field

Various embodiments described herein relate generally to integrated circuits, ICs, and in particular to SOI ICs handling voltages higher than standard digital control voltages.

Description of Related Art

Integrated circuits, ICs, control voltages and currents in semiconductor substrates, of which there are many types. Si (silicon) is the most common substrate and a subset of Si substrates, silicon on insulator, SOI, is also widely used. In SOI, a buried insulator layer (buried oxide layer, BOX) creates an opportunity to dielectrically isolate an upper Si layer from a buried Si substrate, which is typically grounded. This isolation can be used beneficially in many applications, especially radio frequency, RF, and high voltage, HV, circuits. For HV circuits, the buried oxide layer (BOX) and the grounded substrate can cause a back gate effect in which the substrate serves as a gate that can change the potential of the electronic elements of the HV circuits in the upper Si layer causing undesirable leakage currents. The current invention mitigates this effect.

SUMMARY

According to a first aspect of the present disclosure, a silicon on insulator (SOI) structure is presented, comprising: a high resistivity silicon (HR-Si) substrate configured to be coupled to a reference potential; a buried oxide (BOX) layer overlying the HR-Si substrate; a thin silicon layer overlying the BOX layer; a first circuit formed in a first silicon region of the thin silicon layer, the first circuit configured to be coupled to a first switching potential; and a second circuit formed in a second silicon region of the thin silicon layer, the second circuit configured to be coupled to a second potential different from the first switching potential; wherein: the first silicon region forms a first capacitive coupling through the BOX layer, the second silicon region forms a second capacitive coupling through the BOX layer, and a ratio between values of the first capacitive coupling and the second capacitive coupling is adjusted to control: a) a potential at a first surface region of the HR-Si substrate proximate the first silicon region during a transition time of the first switching potential from a low potential level to a high potential level, and b) a potential at a second surface region of the HR-Si substrate proximate the second silicon region during the transition time.

According to a second aspect of the present disclosure, a silicon on insulator (SOI) structure is presented, comprising: a high resistivity silicon (HR-Si) substrate configured to be coupled to a reference potential; a buried oxide (BOX) layer overlying the HR-Si substrate; a thin silicon layer overlying the BOX layer; a first circuit formed in a first silicon region of the thin silicon layer, the first circuit configured to be coupled to a first potential; a second circuit formed in a second silicon region of the thin silicon layer, the second circuit configured to be coupled to a second potential different from the first potential, and at least one through BOX contact (TBC) resistively coupling a local silicon region of one of the first silicon region and the second silicon region to the HR-Si substrate, wherein: a potential difference between the first potential and the reference potential is equal to or larger than 10 V, and a potential difference between the second potential and the reference potential is equal to or smaller than 3 V, the local silicon region comprises one or more transistors sensitive to a back gate effect, and the TBC is configured to bias a potential at a surface region of the HR-Si substrate proximate the local silicon region to a level substantially equal to one of the first potential and the second potential coupled to the local silicon region.

According to a third aspect of the present disclosure, a silicon on insulator (SOI) structure is presented, comprising: a silicon substrate configured to be coupled to a reference potential; a buried oxide (BOX) layer overlying the silicon substrate; a thin silicon layer overlying the BOX layer; a first circuit formed in a first silicon region of the thin silicon layer, the first circuit configured to be coupled to a first potential; a second circuit formed in a second silicon region of the thin silicon layer, the second circuit configured to be coupled to a second potential different from the first potential; at least one N-type implant formed in a region of the silicon substrate underlying a local silicon region of one of the first and the second silicon region of the silicon substrate, and comprising a surface region of the silicon substrate proximate the local silicon region; and at least one through BOX contact (TBC) resistively coupling the local silicon region to the at least one N-type implant, wherein: a potential difference between the first potential and the reference potential is equal to or larger than 10 V, and a potential difference between the second potential and the reference potential is equal to or smaller than 3 V, the local silicon region comprises one or more transistors sensitive to a back gate effect, and the TBC is configured to bias the N-type implant to a potential substantially equal to one of the first potential and the second potential coupled to the local silicon region, thereby reducing the back gate effect over the one or more transistors.

According to a fourth aspect of the present disclosure, a silicon on insulator (SOI) structure is presented, comprising: a silicon substrate configured to be coupled to a reference potential; a buried oxide (BOX) layer overlying the HR-Si substrate; a thin silicon layer overlying the BOX layer; a first circuit formed in a first silicon region of the thin silicon layer, the first circuit configured to be coupled to a first potential; a second circuit formed in a second silicon region of the thin silicon layer, the second circuit configured to be coupled to a second potential different from the first potential; and a control structure formed in one or more of the substrate, the BOX layer and the thin silicon layer, configured to affect an electrical coupling between the thin silicon layer and the HR-Si substrate, wherein: a potential difference between a high level of the first potential and the reference potential is equal to or larger than 10 V, and a potential difference between high level of the second potential and the reference potential is equal to or smaller than 3 V, the control structure is configured to control one or both of: a potential at a first surface region of the HR-Si substrate proximate the first silicon region, and a potential at a second surface region of the HR-Si substrate proximate the second silicon region.

According to a fifth aspect of the present disclosure, a method for reducing a back gate effect in a silicon on insulator (SOI) structure is presented, the method comprising: forming a first silicon region in a thin silicon layer of the SOI structure, the first silicon region configured to be coupled to a first voltage having a high level equal to or higher than 10 V; forming a second silicon region, isolated from the first silicon region, in the thin silicon layer, the second silicon region configured to be coupled to a second voltage having a high level equal to or lower than 3 V; forming a control structure configured to affect a coupling between the thin silicon layer and a silicon substrate of the SOI structure; coupling the first voltage to the first silicon region and the second voltage to the second silicon region; coupling the substrate to a reference potential; based on the forming and the coupling, controlling one or both of: a potential at a first surface region of the substrate proximate the first silicon region, and a potential at a second surface region of the substrate proximate the second silicon region, and based on the controlling, reducing the back gate effect in one or both of the first silicon region and the second silicon region.

According to a sixth aspect of the present disclosure, a method for fabricating a silicon on insulator (SOI) structure to enable coexistence of a high voltage (HV) circuit and a low voltage (LV) circuit is presented, the method comprising: forming a first silicon region in correspondence of the HV circuit in a thin silicon layer of the SOI structure, the first silicon region configured to be coupled to a first voltage having a high level equal to or higher than 10 V; forming a second silicon region in correspondence of the LV circuit, isolated from the first silicon region, in the thin silicon layer, the second silicon region configured to be coupled to a second voltage having a high level equal to or lower than 3 V; based on the forming, measuring a first surface region and a second surface region of the first and the second silicon regions; based on the measuring, forming additional silicon and/or metal plate structures adjacent to the first and/or second silicon regions, thereby enlarging the first and/or second surface regions; and based on the additional forming, obtaining a desired ratio between a value of a first capacitive coupling of the first silicon region to a proximate first surface of a substrate of the SOI structure, and a value of a second capacitive coupling of the second silicon region to a proximate second surface of the substrate.

BRIEF DESCRIPTION OF THE DRAWINGS

The accompanying drawings, which are incorporated into and constitute a part of this specification, illustrate one or more embodiments of the present disclosure and, together with the description of example embodiments, serve to describe the invention.

FIG. 6A shows two such implants, each formed under a different circuit, subjected to a different high voltage.

Like reference numbers and designations in the various drawings indicate like elements

DETAILED DESCRIPTION

The majority of integrated circuits, ICs, used in such applications as cell phones, personal computers and consumer electronics, operate at relatively low voltages, typically below 5 V and often below 3 V. High voltages, which in the present disclosure are defined as any DC voltage above 5 V, are becoming more prevalent due to the efficiency of storing energy at these voltages, especially in batteries. It is not uncommon to find battery storage such as that in hybrid cars or in solar power systems to be in the 10-100 V range.

Such high voltages can be controlled directly or can be reduced to lower voltages for control by standard ICs. For example, in either a hybrid car or solar powered house, the high voltage coming from a battery or solar panel must be reduced from 10-100 V, to 1-3 V to be used by consumer electronics ICs.

Conversion from high to low voltage is often performed by DC-DC converters due to their small size, high efficiency and flexibility. It is desirable to provide critical circuit for DC-DC converters in IC form, but to do so, such critical circuit should be able to handle the high voltages. An example of such conversion circuit can be found in the above referenced U.S. application Ser. No. 14/661,848 entitled "Level Shifter", which is herein incorporated by reference in its entirety.

Figure 1:
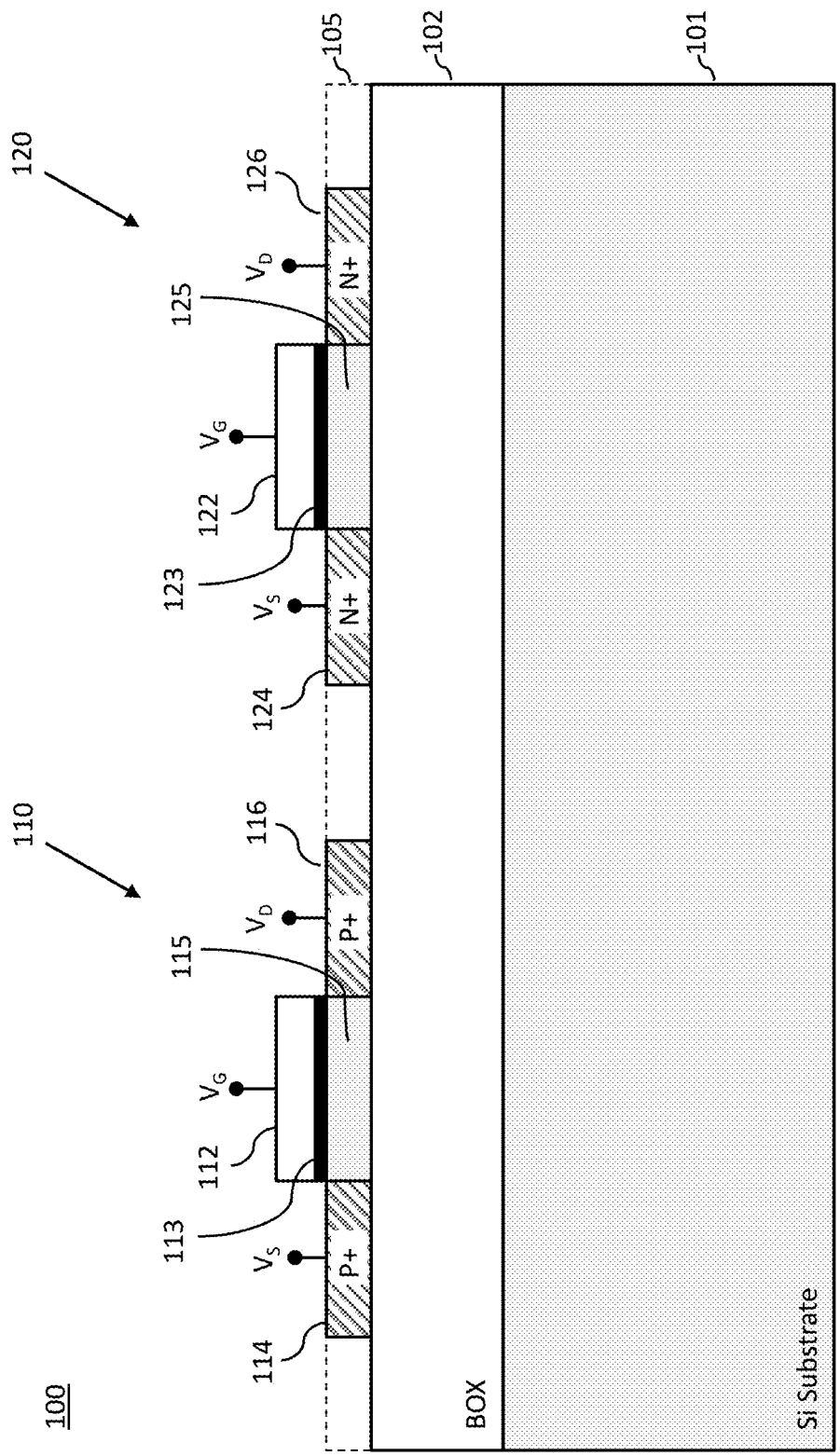
FIG. 1 shows cross sectional views of SOI MOSFET transistors fabricated in a layered SOI structure atop a silicon substrate, including a P-type MOSFET transistor and an N-type MOSFET transistor, where the transistors comprise silicon regions formed in a thin silicon layer atop a buried oxide layer.

FIG. 1 shows cross sectional views of typical SOI MOSFET transistors fabricated on SOI, including a P-type MOSFET (110) and an N-type MOSFET (120). The P-type MOSFET (110) comprises a gate polysilicon region (112) which defines a gate channel (115), an insulating gate silicon oxide layer (113) which insulates region (112) from the gate channel (115), a source region (114) and a drain region (116). The N-type MOSFET (120) comprises similar regions (122, 125, 123, 124, 126) with the difference that the N and P type doping regions are reversed.

As shown in the cross sectional views of FIG. 1, the SOI MOSFETs comprise a layered structure, formed atop a substrate (101), and comprising a buried insulator layer (102), and a thin silicon layer (105) in which the active regions (114, 115, 116) and (124, 125, 126) are formed. In the exemplary case shown in FIG. 1, the substrate (101) is a relatively high conductivity silicon (Si) substrate with a resistivity substantially lower than 1000 Ω·cm, such as, for example, 10 Ω·cm or lower In the exemplary case shown in FIG. 1, the buried insulator layer (102), also known as the buried oxide layer (BOX), is designed to provide electrical insulation between the active regions (114, 115, 116, 124, 125, 126) formed in the thin silicon layer (105) and the substrate (101).

As known by a person skilled in the art, a gate voltage, $V_G$, is applied to a gate electrode (connected to the gate polysilicon region (112, 122) of a transistor (110, 120), inducing an electric field in the gate oxide layer (113, 123), thereby turning ON or OFF the transistor by inverting or accumulating the surface of the Si (gate) channel (115, 125). The N-type SOI MOSFET (120) operates on positive voltages (e.g. positive $V_G$ causes the transistor to turn ON), and the P-type SOI MOSFET (110) operates on negative voltages (e.g. negative voltage $V_G$ causes the transistor to turn ON).

The SOI MOSFETs (110, 120) typically operate at source-drain voltages, $V_{DS}=V_D-V_S$, applied between the source, S (114, 124), and drain, D (116, 126), of less than 3 V, and often down to less than 1 V. According to the present disclosure, transistors operating at such low $V_{DS}$ voltages are defined as "grounded transistors" since the lowest $V_{DS}$ voltage is approximately 0 V, or ground, GND.

Such grounded transistors can, however, float up to much higher voltages as long as their $V_{DS}$ is maintained below their designed operating limit. For example, the N-type MOSFET (120) shown in FIG. 1 can operate with its source, S (124), held at 70 V and its drain, D (126), held at 73 V. To turn ON and OFF such a transistor, a gate voltage $V_G$ of between 70 and 73 V can be used. Likewise, the P-type MOSFET (110) shown in FIG. 1 can also operate at 70 V, but in this case, the lowest voltage is applied to the drain, D (116), at 70 V, and the source, S (114), is at 73 V. Accordingly, a gate voltage $V_G$ of 73 V can turn OFF the P-type MOSFET (110) while a gate voltage $V_G$ of 70 V can turn it ON. According to the present disclosure, transistors controlled by such high voltages (comprising a high DC voltage offset, either positive or negative with respect to a reference voltage) while maintaining normal operating voltages between terminals (source, drain, gate) of the transistors are defined as "floating transistors". In many cases, it can be desirable that both grounded transistors and floating transistors operate normally in a same IC on a same SOI substrate. It follows that according to the various embodiments of the present disclosure, methods and devices for operating grounded transistors and floating transistors in a same IC on a same SOI substrate are presented.

In both NMOS (N-type MOSFET) and PMOS (P-type MOSFET) cases, the transistors work just as they do without high voltage offset, i.e., they can be used in digital or analog circuit. However, the high voltage offset has several side effects that must be considered and dealt with. The largest such side effect, and the one of primary concern for the present invention, is that the high voltages induce electric fields in the buried oxide layer, BOX (102), of FIG. 1, and thereby couple (e.g. capacitively) to the substrate (101). As a consequence, and as known to a person skilled in the art, the substrate (101) can effectively operate like a parasitic gate electrode, commonly called a "back gate", which can affect the overall performance of the MOSFET. As known to a person skilled in the art, effects of such back gate, may include, for example, impact on a leakage current of the MOSFET, shift of a threshold voltage of the MOSFET, and/or turning ON or OFF the so-called "back channel" of a thin film MOSFET transistor (e.g. transistors (110, 120) of FIG. 1, thin film being reference to the relatively thin Si layer (105)), the back-channel being a region (e.g. 280 of FIG. 2A, later described) of the thin film transistor gate channel (e.g. (115, 125) of FIGS. 1 and 2A) proximate the buried oxide layer (e.g. 102 of FIG. 1).

Figure 2A:
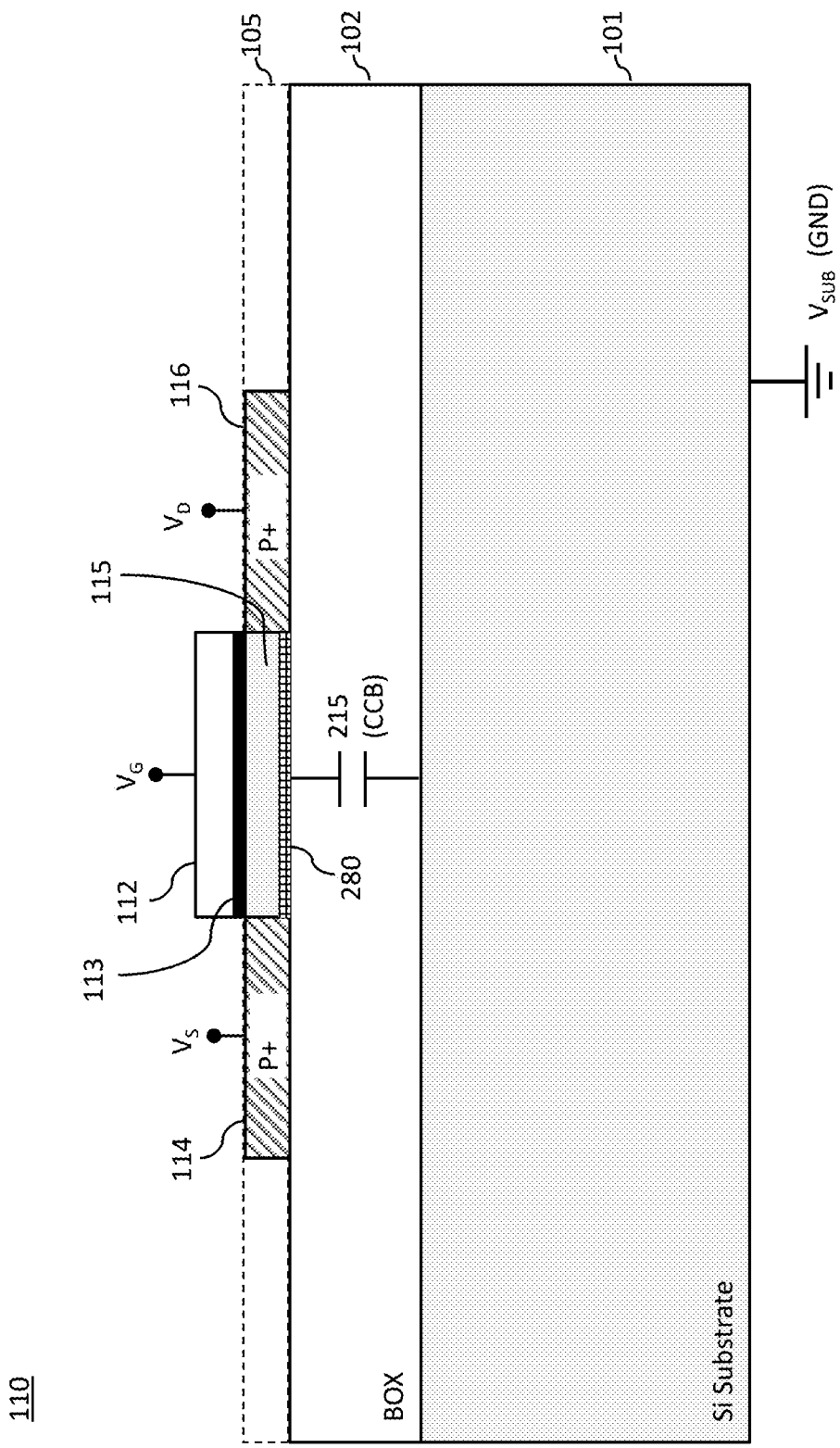
FIG. 2A shows a mechanism by which a back gate effect is created in the P-type MOSFET transistor of FIG. 1, including a capacitive coupling between the silicon regions of the thin silicon layer forming the transistor and the silicon substrate through the buried oxide layer.

FIG. 2A shows the back gate effect. In this example, the substrate is held at a voltage $V_{SUB}$ equal to ground, GND, (for example, by being grounded in a package, and having a relatively conductive substrate (101) material) while the transistors are at a DC offset voltage of 15 V. For the PMOS transistor (110), during normal operation, its source, S (114), is at a voltage $V_S$=18 V, its drain, D (116), is at a voltage $V_D$=15 V, and its gate (112) operates at a voltage $V_G$ between 18 and 15 V. Therefore, the grounded substrate (101) is at a voltage $V_{SUB}$ which is 18 V negative with respect to the source, S (114), of the PMOS transistor (110), which voltage can therefore induce changes to the conductivity of the back channel and therefore induce changes in the current seen between S (114) and the D (116) that may not be controllable by the G (112). A person skilled in the art would understand that the turning ON of the back channel responsive to the voltage $V_{SUB}$ may further be a function of the BOX layer (102) thickness and a back channel doping concentration of the PMOS transistor (110).

With further reference to FIG. 2A, depending on a level of the high voltage applied to the transistor (115), the thickness of the BOX layer (102), and the doping in the back channel, the back channel PMOSFET, controlled by the substrate (101) voltage $V_{SUB}$, can either exhibit back gate induced leakage currents or outright turn ON. In other words, there can be a current Ism from the source (114) to the drain (116) through the back channel (280) that is not under control of the voltage $V_G$ at the top gate (112) of the transistor (110).

Based on the above example, a person skilled in the art readily understands that every PMOSFET (formed on the same layered structure as the PMOSFET (115)) operating at a high positive offset voltage can exhibit a similar leakage current. Furthermore, since the source region, S (114), and the drain region, D (116), are the same for both the top transistors controlled by their gate voltages (e.g. $V_G$) and the backside transistors controlled by their back gate voltages (e.g. $V_{SUB}$), the back channel leakage current $I_{SDB}$ flows into a topside circuit comprising the topside transistors, causing numerous issues. Such topside circuit is typically designed based on an OFF PMOSFET having OFF $I_{DS}$ currents of typically less than nanoamps of leakage current. However, the back gate effect can induce back channel $I_{DS}$ currents (e.g. $I_{SDB}$) that are both uncontrolled by the topside circuit and possibly unpredictable. Such back channel $I_{DS}$ currents in the back channel transistors can be orders of magnitude more current than the anticipated sub nanoamps of normal leakage current. The back channel $I_{DS}$ currents are effectively parasitic currents that can upset operation or disable the designed topside circuit.

A person skilled in the art would understand that an NMOSFET transistor (e.g. (110) of FIG. 1) can suffer a similar back channel leakage when the substrate (101) is positive with respect to a source (e.g. (124) of FIG. 1) of the NMOSFET transistor. This can occur, for example, if the NMSOFET (circuit) is floated to −15 V, thereby making the substrate 15 V positive with respect to the source of the floating NMOSFET. It should be noted that back channel leakage can also occur, for example, if positive floating (high) voltages from the top side (floating) NMOSFET transistors (circuit) are coupled to the substrate (101) and then spread under grounded (low voltage) NMOSFETs formed in a same layered structure as the floating NMOSFET transistors, as discussed below.

Figure 2B:
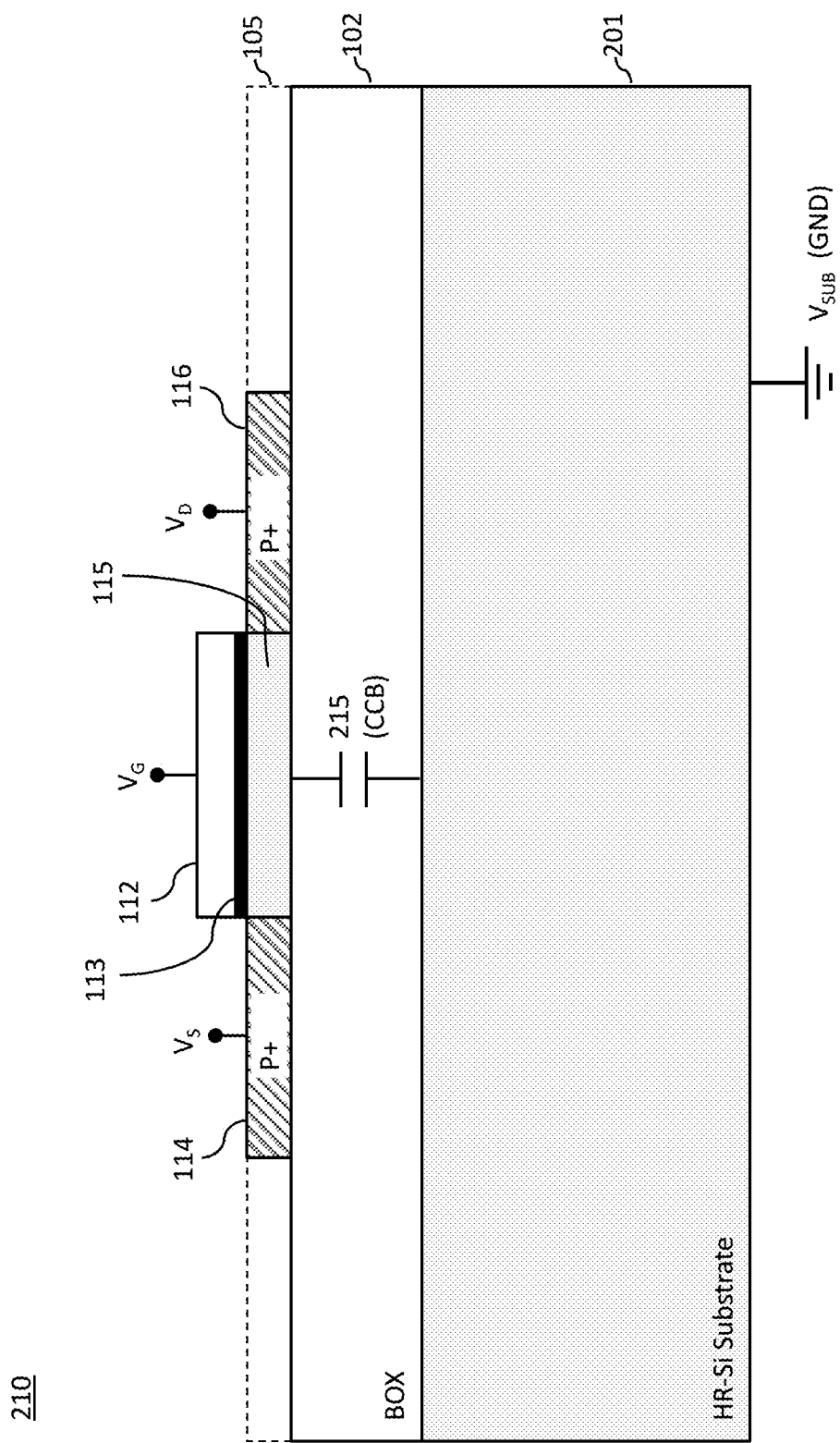
FIG. 2B shows a cross sectional view of an SOI PMOSFET transistor fabricated in a layered SOI structure atop a high resistivity silicon substrate.

The above discussion as related to the FIGS. 1 and 2A, describe the back gate effect in transistors formed in a layered SOI structure comprising a substrate (101) with relatively high conductivity and therefore relatively low resistivity. As used herein, low resistivity silicon, Si, substrate is defined as a silicon substrate with a resistivity substantially lower than 1000 Ω·cm, such as, for example, 10 Ω·cm or lower. As known to a person skilled in the art, MOSFETs (e.g. circuit using MOSFETs) can equally be formed in layered SOI structures using a relatively high resistivity silicon substrate as shown in FIG. 2B. As used herein, high resistivity silicon, HR-Si, substrate is defined as a silicon substrate with a resistivity substantially higher than 10 Ω·cm, such as, for example, approximately 1000 Ω·cm or larger. Usage of such HR-Si substrate in a layered SOI structure can further influence coupling of floating voltages to floating and grounded transistors formed in the layered SOI structure, which can further complicate the back channel effects. A person skilled in the art would know how to choose substrate (101) resistivity according to a specific application requirement (e.g., high voltage level). The higher the resistivity, the higher the breakdown voltage (e.g., according to a square root relationship) and therefore the higher voltage that can be applied to a circuit formed above.

With further reference to FIG. 2A, the capacitor (215) represents a capacitive coupling between the PMOSFET transistor (110) and the substrate (101). Surfaces of the structures (e.g. 114, 115, 116) of the PMOSFET (110), created in the silicon layer (105), adjacent to the insulating layer (102), form a top plate of the capacitor (215), with a corresponding reciprocal bottom plate forming at the surface of the Si substrate (101). The top plate, bottom plate and corresponding in-between region of the insulating layer (102) forming the capacitor (215). A person skilled in the art would understand that larger structures of the PMOSFET (110) can create a larger capacitor (215) as such larger structure can have larger surfaces (areas) and therefore can create a larger top plate. The surface (area) of the bottom plate follows the surface of the top plate. As the capacitor (e.g., equivalent capacitance) can be a function of a surface of the silicon used in a top device, it follows that a plurality of neighboring PMOSFET transistors, similar to the PMOS transistor (110), formed on the same layered SOI structure depicted in, for example, FIG. 1, can form a larger top plate and therefore a larger capacitor (215). It also follows that silicon used in a top circuit, whether part of a transistor device or of a component, such as capacitor used in a circuit, can contribute to a size of the capacitor (215). A similar capacitor can be associated to the NMOSFET (120) of FIG. 1, formed in a similar fashion as capacitor (215) associated to the PMOSFET (110), whose capacitance can also be a function of a total surface of a top circuit formed in the silicon layer (105).

With further reference to FIG. 2B, a cross sectional view of an SOI PMOSFET transistor (210) is shown. As shown in the cross sectional views of FIG. 2B, the SOI PMOSFET (210) comprises a layered structure, formed atop a HR-Si substrate (201), and comprising a buried insulator (BOX) layer (102), and a thin silicon layer (105) in which the active source, gate, drain regions (114, 115, 116) are formed. In the exemplary case shown in FIG. 2B, the buried insulator layer (102) is designed to provide electrical insulation between the active regions (114, 115, 116) formed in the thin silicon layer (105) and the HR-Si substrate (201). A person skilled in art readily knows that by virtue of its high resistivity, the HR-Si substrate (201) may have a substrate conductivity at a substrate region proximate the BOX layer (102) (e.g. top surface of the substrate (201) as shown in FIG. 2B) which is different from a substrate conductivity at a backside of the substrate (201) (e.g. bottom surface of the substrate (201) shown connected to GND), often 10's to 100's of micrometers (μm) away. The top surface of the HR-Si substrate (201) can therefore float to a potential substantially different from a potential of the back of the HR-Si substrate (201), the potential at the top surface of the HR-Si effectively being the back gate potential of the back channel FET.

Figure 2C:
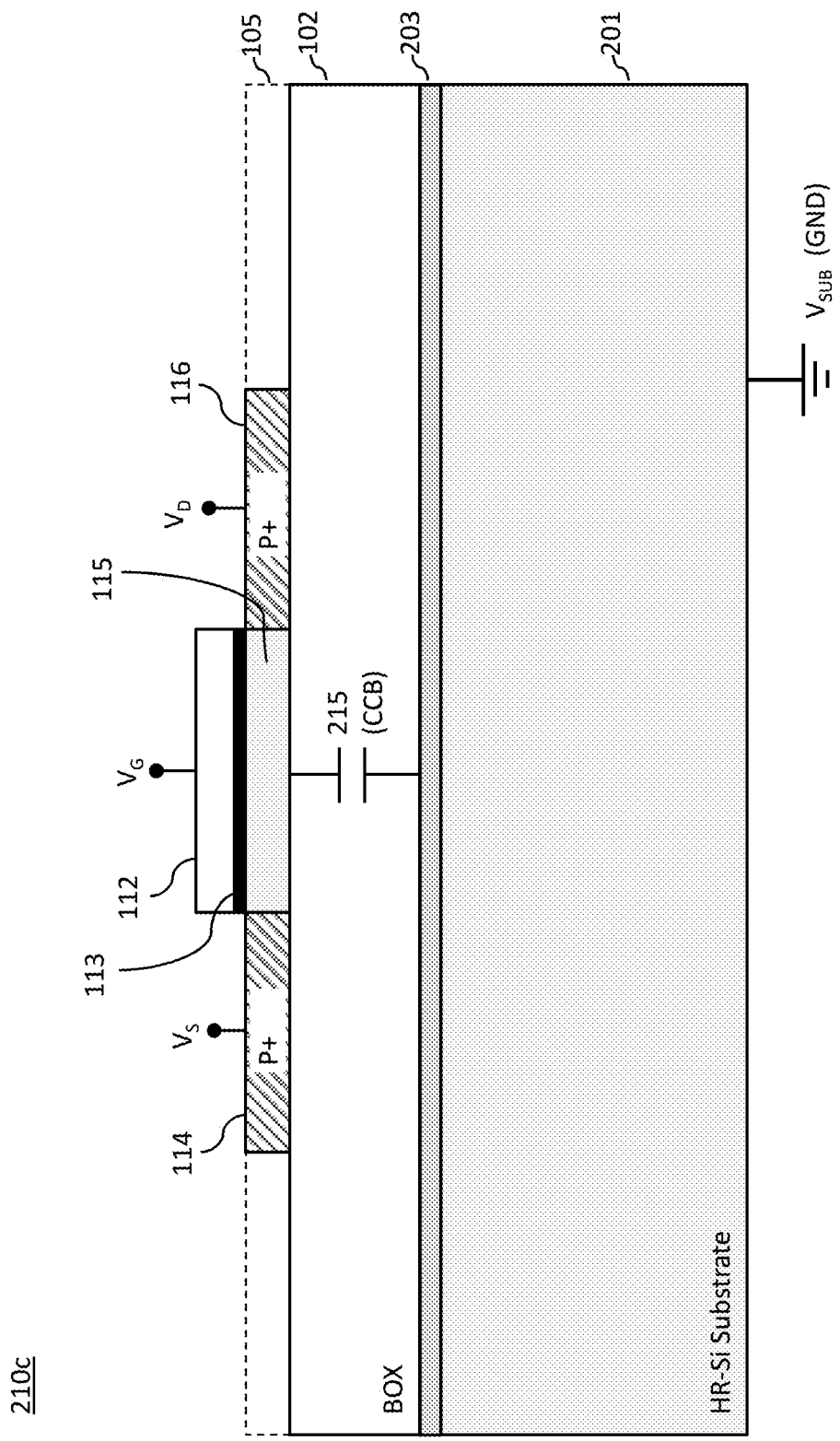
FIG. 2C shows a cross sectional view of an SOI PMOSFET transistor fabricated in a layered SOI structure atop a high resistivity silicon substrate comprising an optional trap rich layer.

FIG. 2C shows a cross sectional view of an SOI PMOSFET transistor (210c) comprising a layered structure similar to one described above with relation to FIG. 2B, with an added trap rich (TR) layer (203). A person skilled in the art would know of the added benefits that such TR layer (203) may provide in SOI devices used in RF applications and may therefore decide to optionally form such layer atop the HR Si substrate (201) given various methods and techniques known in the art. The various embodiments according to the present disclosure may equally apply to SOI MOSFETs formed on layered structures with or without a trap rich layer (203).

Based on the above, it becomes clear to a person skilled in the art that in the exemplary case of high resistivity (HR-Si) substrates, not only can the back channel gate voltage float to uncontrolled levels, it can also float to different levels across an area of any given IC. This means there may be multiple regions of various and different back channel gate voltages, further complicating use of HR-Si substrates for high voltage circuit on SOI.

Figure 3:
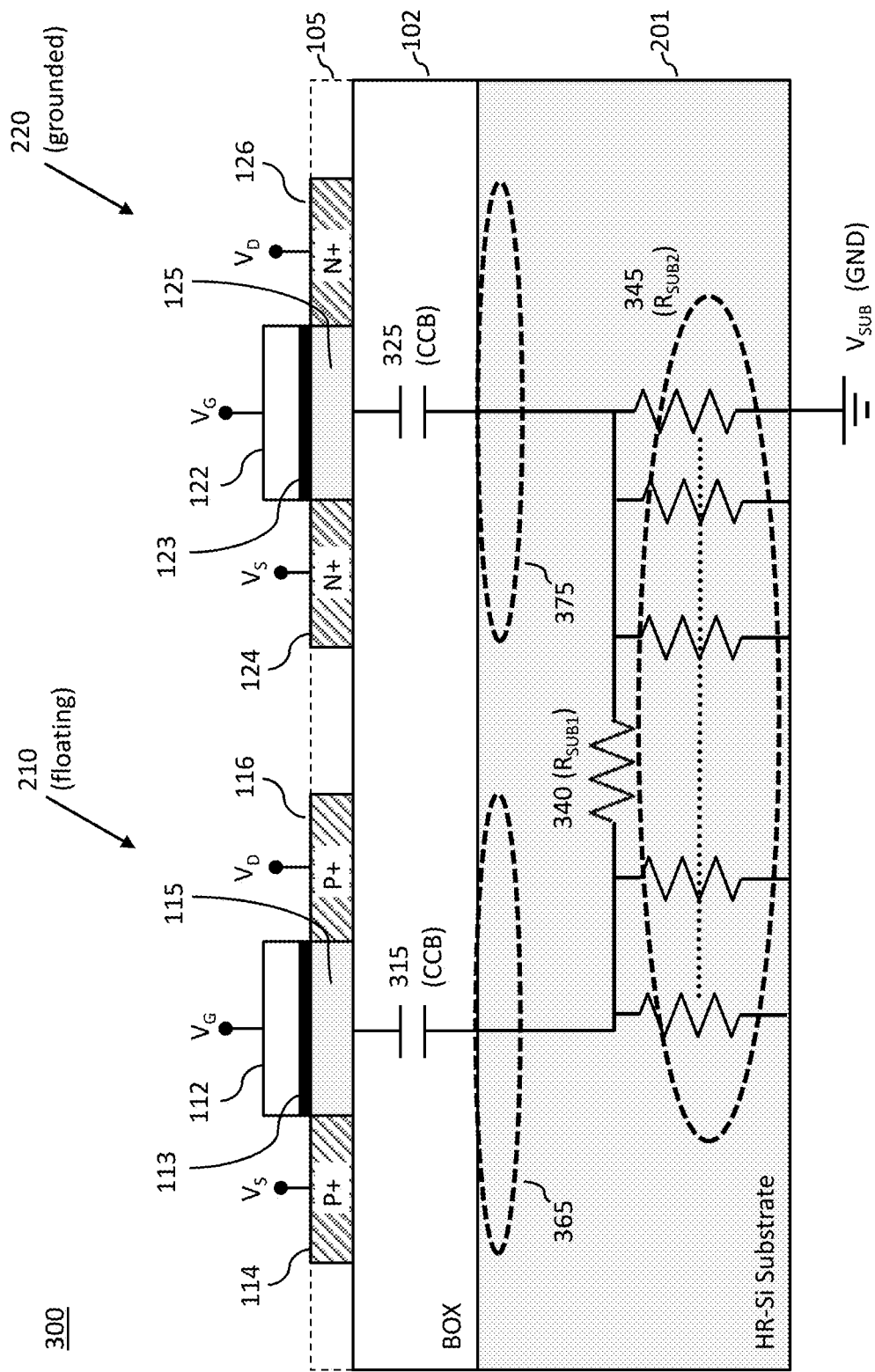
FIG. 3 shows a cross sectional view of a floating P-type MOSFET transistor (e.g. referenced to a high voltage supply) and a grounded N-type MOSFET transistor (e.g. referenced to a ground potential) fabricated in a layered SOI structure atop a high resistivity silicon substrate, where each such transistor comprises a source terminal, a gate terminal and a drain terminal to which corresponding control voltages ($V_S$, $V_G$, $V_D$) can be applied. Capacitive-resistive cross-couplings between the silicon regions of the thin silicon layer forming the transistors and the high resistivity substrate are also shown, where capacitive couplings are formed through the buried oxide layer, and resistive couplings are formed through the high resistivity silicon substrate.

FIG. 3 shows a cross sectional view of a floating PMOSFET transistor (210) and a grounded NMOSFET transistor (220) fabricated in a layered SOI structure atop a HR-Si substrate (201) as discussed above with reference to FIG. 2B. Resistive couplings between top regions (365, 375) of the HR-Si substrate (201) proximate the transistors (210, 220) which define corresponding back gate voltages and the bottom region of the HR-Si (at $V_{SUB}$ potential) are shown as equivalent resistance $R_{SUB1}$ (340) and equivalent distributed resistance $R_{SUB2}$ (345), whereas coupling of potentials at the top regions (365, 375) to the transistors (115, 125) by way of capacitive coupling through the insulating BOX layer (102) is shown as capacitors (315, 325). As shown in FIG. 3, the equivalent distributed resistance $R_{SUB2}$ can be formed by a distribution of a number of elemental resistive paths in parallel, each elemental resistive path being defined by the resistivity of the substrate and a length of the path along the substrate (201). It should be noted that the cross sectional view depicted in FIG. 3 is not to scale, as transistors (210) and (220) may be at a relative distance of, for example, several 10's to 100 micrometers, so several orders of magnitude larger when compared to sizes of the structures of the transistors (115, 125) as shown in the FIG. 3.

With further reference to FIG. 3, the capacitor (315) represents a capacitive coupling between the PMOSFET transistor (210) and the HR-Si substrate (201) through the insulating layer (102). Surfaces of the structures (e.g. 114, 115, 116) of the PMOSFET (210), created in the silicon layer (105), adjacent to the insulating layer (102), form a top plate of the capacitor (315), with a corresponding reciprocal bottom plate forming at the surface of the HR-Si substrate (201). The top plate, bottom plate and corresponding in-between region of the insulating layer form the capacitor (315). A person skilled in the art would understand that larger structures of the PMOSFET (210) can create a larger capacitor (315) as such larger structure can have larger surfaces (areas) and therefore can create a larger top plate. The surface (area) of the bottom plate follows the surface of the top plate. As the capacitor can be a function of a surface of the silicon used in a top device, it follows that a plurality of neighboring PMOSFET transistors, similar to the PMOS transistor (210), formed on the same layered SOI structure depicted in FIG. 3, can form a larger top plate and therefore a larger capacitor (315). It also follows that silicon used in a top circuit, whether part of a transistor device or of a component, such as capacitor used in a circuit, can contribute to a size of the capacitor (315). Capacitor (325) associated to the NMOSFET (220) is formed in a similar fashion and can also be a function of a total surface of a top circuit formed in the silicon layer (105).

With further reference to FIG. 3, for an exemplary non-limiting case of an HR-Si substrate (201) with a resistivity of about 1000 Ω·cm and a thickness of about 100 to 150 micrometers, a value of the equivalent resistance $R_{SUB1}$ can be in the order of about 30 MΩ, and a value of the equivalent distributed resistance $R_{SUB2}$ can be in the order of about 250 KΩ. It should be noted that although a relative distance between the two top regions (365, 375) can be of a same order of magnitude as a thickness of the HR-Si substrate (201), the value of the equivalent distributed resistance $R_{SUB2}$ is substantially lower than the value of the equivalent resistance $R_{SUB1}$ due to mainly a current spreading provided by a larger conduction cross section between a top region (e.g. 375) and the bottom region of the substrate (201) as compared to a current spreading provided by a conduction cross section between the top region (365) and the top region (375). In other words, a larger conduction cross section between two regions of the substrate (201) is equivalent to a larger number of elemental resistive paths in parallel, thereby reducing the equivalent resistance value, each elemental resistive path being defined by the resistivity of the substrate and a distance between the two regions.

Considering an exemplary non-limiting case where the PMOSFET (210) of FIG. 3, which is near the grounded NMOSFET (220), floats to 15 V, the PMOSFET (210) (which can be part of a circuit) couples its 15 V floating voltage to the HR-Si substrate (201), thereby raising a potential at the region (365) up toward 15 V. In turn, this higher substrate potential can spread (resistively) along the surface of the HR-Si substrate (201) from the region (365) to the region (375) under the NMOSFET (220), thereby creating a positive back gate voltage under the NMOSFET (220), which in turn creates back channel leakage currents in the NMOSFET (220) as discussed above. A person skilled in the art would realize that the positive back gate voltage created in the region (375) under the NMOSFET (220) can be dependent on a relative distance of the two transistor devices (115, 125). For example, if the PMOSFET (220) is located at a large distance from the NMOSFET (220), the resistive spreading of the potential at the region (365) to the region (375) can cause a reduction of the back gate voltage of the NMOSFET (220) formed in the region (375), and thereby causing a reduction in a corresponding parasitic back channel leakage of the NMOSFET transistor (220).

Based on the above description, it becomes clear that there can be some undesired effects associated with using floating SOI PMOSFET transistors and/or SOI NMOSFET transistors in a circuit (herein referred to as "floating circuit"). In one aspect, floating circuit to high voltages (e.g. positive high voltages) can induce back channel effect related leakage in both the PMOSFET transistors and in the NMOSFET transistors of the circuit. In another aspect, back channel effects can be localized and dependent on layout geometries.

A person skilled in the art would understand that the exemplary cross sectional view depicted in FIG. 3 serves as a basis for describing issues related to floating circuits and therefore should not be considered as limiting the scope of the present disclosure. Based on the above description, the person skilled in the art would understand that, for example, a NMOSFET transistor floating to a high voltage can induce a positive back gate voltage on a neighbor floating and/or grounded NMOSFET transistor. Also, as another example, based on the above description, the person skilled in the art would understand that a large area of floating transistors can induce a higher voltage than a smaller area due to the well-understood nature of capacitive coupling, as the larger area can create a larger capacitor (e.g. 315) than a smaller area.

The various embodiments according to the present disclosure attempt to reduce the above described back channel effects by controlling HR-Si substrate potentials under floating and/or grounded devices (e.g. at regions (365, 375) of FIG. 3) formed in a layered SOI structure (e.g. FIG. 2B and FIG. 3). Each embodiment according to the present disclosure comprises structures that control the substrate potentials below high and low voltage regions (e.g. regions below floating and grounded devices, such as regions (365, 375) of FIG. 3) of an SOI IC. A person skilled in the art would understand that the previously described back gate effects occur when a surface potential under a region formed in the upper silicon film (105) is sufficiently different from a potential of the region such that a back channel in a transistor formed in that region of the upper silicon film (105) can be induced to conduct current. As discussed above, the region can be a region associated to one device (NMOSFET, PMOSFET) or to a plurality of devices combined to form a functional circuit. Several such functional circuits may be formed in different regions of an SOI IC and operate at different voltages, such as, for example, one circuit operating at a high voltage and another circuit operating at a low voltage. It should also be noted that depending of a functionality of a circuit and/or device, back gate induced parasitic leakage currents may or may not pose operation issues of the circuit and/or device. Accordingly, the various embodiments of the present disclosure may be used to control surface potentials of the substrate under sub-regions of a circuit where corresponding devices need to be protected against back gate related effects.

Figure 4A:
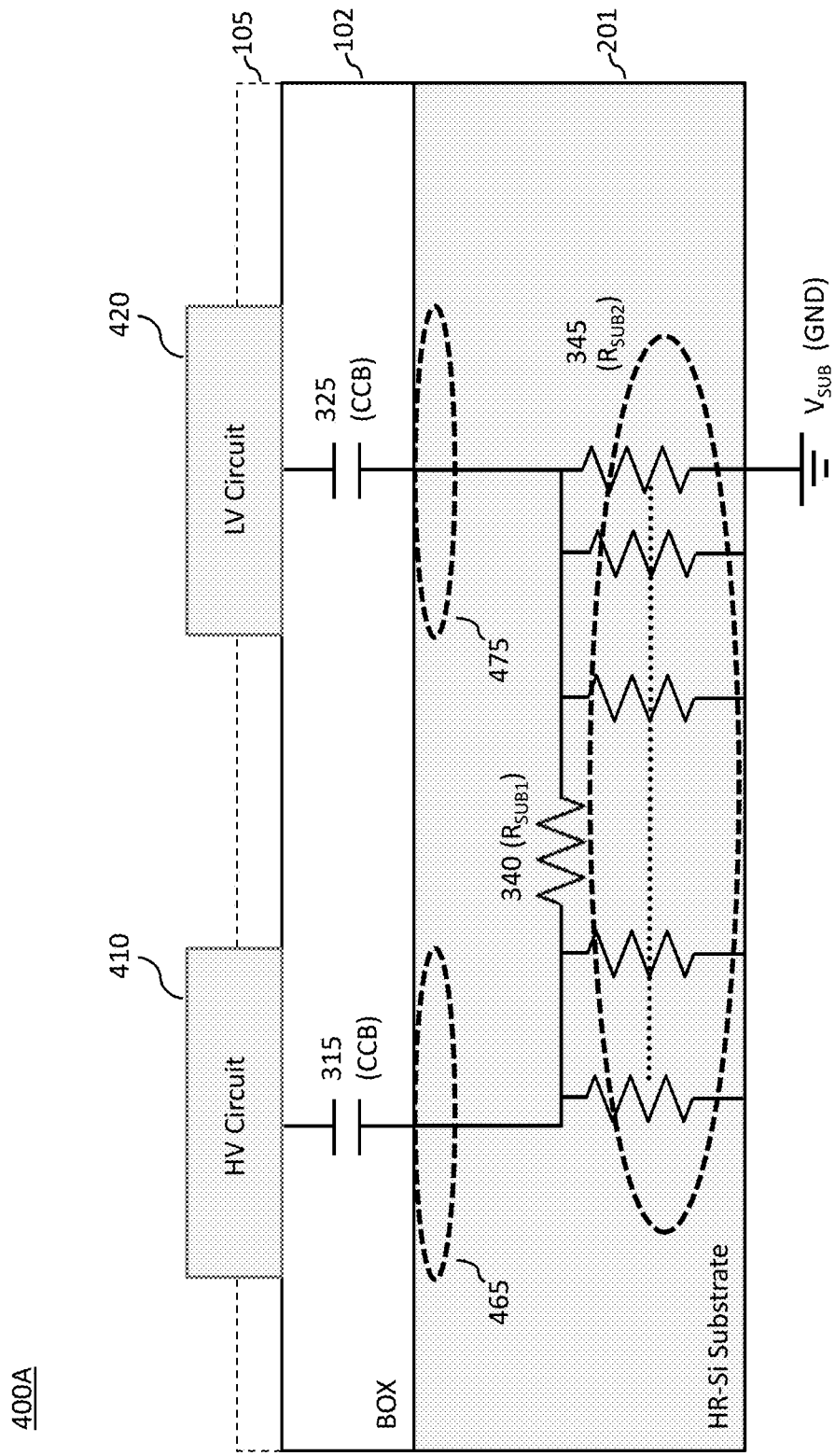
FIG. 4A shows a simplified cross sectional view of a high voltage circuit and a low voltage circuit formed in a layered SOI structure atop a high resistivity substrate, where the high voltage circuit comprises floating transistors (e.g. referenced to a high voltage supply) and the low voltage circuit comprises grounded transistors, as show, for example, in FIG. 3.

FIG. 4A shows a simplified cross sectional view of a high voltage (HV) circuit (410) and a low voltage (LV) circuit formed in a layered SOI structure using a HR-Si substrate (201). The HV circuit (410) can be formed by a plurality of floating devices, such as the device (210) of FIG. 3, interconnected with passive components (e.g. capacitors, resistors) to provide a desired functionality of the HV circuit. Likewise, the LV circuit (420) can be formed by a plurality of grounded devices, such as the device (220) of FIG. 3, interconnected with passive components (e.g. capacitors, resistors) to provide a desired functionality of the LV circuit. As discussed above with reference to FIG. 3, top plates of each of the capacitors (315) and (325) can be formed by a combined surface of silicon structures in the silicon layer (105) that form each of the HV and LV circuits.

With further reference to FIG. 4A, it should be noted that the HV circuit (410) can operate from a high DC voltage, but can also operate from a switching high voltage, as described in the above referenced U.S. application Ser. No. 14/661,848 entitled "Level Shifter", which is herein incorporated by reference in its entirety. It follows that the various embodiments according to the present disclosure reduce the above described back channel effects in consideration of both time dependent and DC, i.e., equilibrium steady state potentials at the surface regions (465, 475) of the HR-Si substrate (201) under the HV (410) and LV (420) circuits.

Figure 4B:
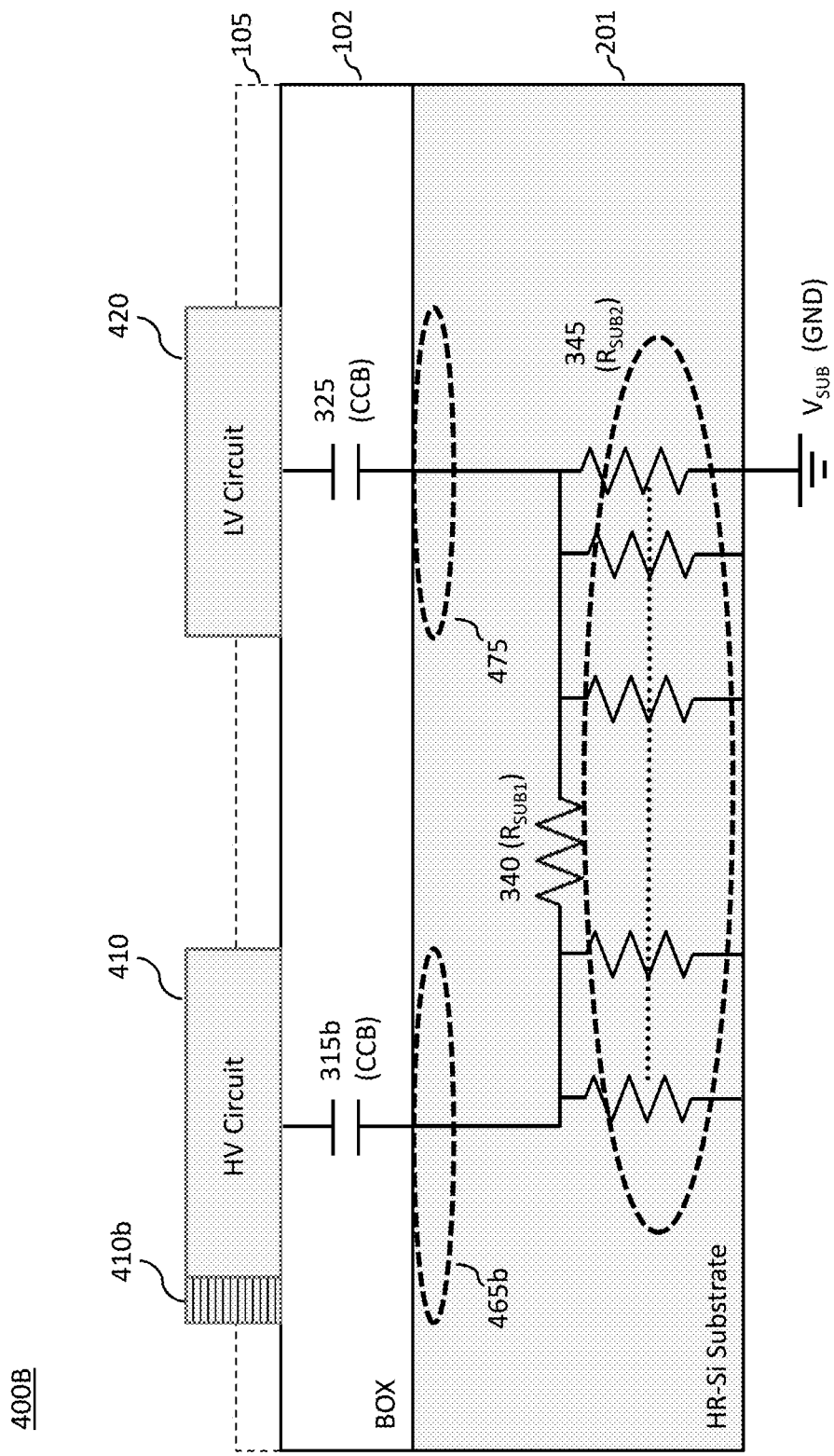
FIG. 4B shows an embodiment of the present disclosure referred to as Capacitive Coupling through BOX (CCB), where a capacitive coupling through the buried oxide (BOX) layer formed by silicon regions of the high voltage circuit of FIG. 4A is adjusted to control a voltage at a surface region of the high resistivity silicon substrate proximate the high voltage circuit, and a voltage at a surface of the high resistivity silicon substrate proximate the low voltage circuit, thereby mitigating back gate effects affecting both the high voltage circuit and the low voltage circuit.
Figure 4C:
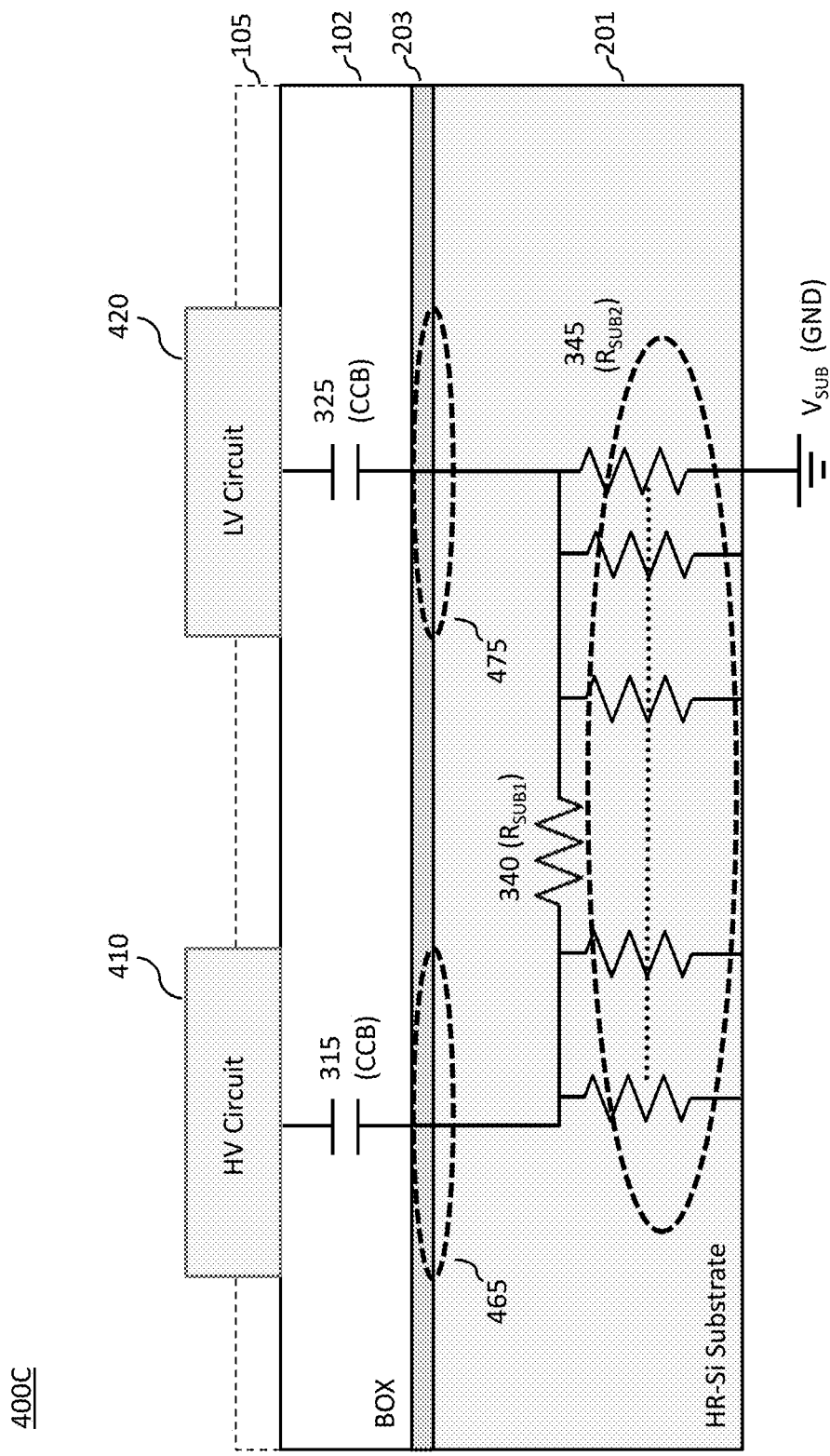
FIG. 4C shows a simplified cross sectional view of a high voltage circuit and a low voltage circuit formed in a layered SOI structure atop a high resistivity substrate comprising an optional trap rich layer, where the high voltage circuit comprises floating transistors (e.g. referenced to a high voltage supply) and the low voltage circuit comprises grounded transistors, as show, for example, in FIG. 3.

A person skilled in the art would understand that for most frequencies in time dependent consideration, an optional trap rich, TR, layer (203) (as shown in FIG. 4C) can provide a higher isolation between the surface regions (465) and (475). In this case, based on the capacitive coupling between each of the HV (410) and LV (420) circuits and the corresponding regions (465, 475) of the substrate (201), at relatively higher frequencies, substrate (201) potentials at regions (465) and (475) will approximately track the potentials of the HV (410) circuit and LV (420) circuit respectively. Although the various embodiments according to the present disclosure are described with respect to a HV circuit and a LV circuit formed in a layered structure devoid of the trap rich, TR, layer (203) (e.g. per FIG. 4A), same embodiments may equally apply to a configuration comprising a TR layer (203), as depicted, for example, in FIG. 4C.

As the frequency under consideration goes lower, eventually reaching a steady state DC voltage, the effect of the TR layer (203) becomes weaker and the high isolation between the surface regions (465) and (475) cannot be provided. As a consequence, corresponding surface potentials seek their equilibrium value. This leads to cross coupling of the HV (410) and LV (420) potentials to surface regions of the substrate (201) having different potentials (e.g. coupling of HV (410) circuit potential to surface region (475)). Subsequent descriptions of different embodiments according to the present disclosure focus on DC voltage effects, since mitigating them will mitigate higher frequency effects as well.

With further reference to FIG. 4A, according to an embodiment of the present disclosure, herein referred to as Capacitive Coupling through BOX, "CCB", the back gate effect is controlled, during a transition time of a high voltage from its low level to its high level, by designing capacitive coupling (315) from a first region (410) of the upper Si film (105) being subjected to a first voltage (e.g. a switching high voltage, transitions between a low level and a high level) to the substrate (201) and from a second region (420) of the upper Si film (105) being subjected to a second voltage (e.g. low voltage) to the substrate (201) such that the substrate region (465) formed in the Si film (105) under the first region (410), and the substrate region (475) formed in the Si film (105) under the second region (420) of the Si film (105), are substantially equal to the respective voltages of the film regions (410, 420). This mechanism is further depicted in FIG. 4B, where the capacitive coupling (315) of FIG. 4A is modified by adding a region (410b), comprising silicon, metal or a combination thereof, to the region (410), to provide the desired voltages in the regions (465b) and (475). Alternatively, or in addition, a similar region can be added to the region (420) to provide the desired voltages under each of the regions. Accordingly, the CCB method according to the present disclosure controls voltages, during a transition time of the first voltage (e.g., from a low level to a high level), at surface regions (465, 475) of the substrate (101) under the Si film regions (410, 420) by designing the capacitive couplings (315, 325). Furthermore, the voltage at the surface regions (465, 475) may be maintained even past the transition time if a period of the switching voltage is smaller than an RC time constant associated with the voltage at surface regions. In other words, the CCB method according to the present disclosure can work for a time past the transition time. As described above, each of the regions (410) and (420) can be comprised of a single PMOSFET or NMOSFET transistor, or circuit comprising such transistors interconnected through passive components which can also be formed in the Si film (105). Furthermore, it should be noted that a high voltage to which the region (410) can be subjected to, can be either a DC voltage or a switching voltage.

In operation, the CCB according to the present disclosure depicted in FIGS. 4A and 4B, can provide a capacitive voltage divider between the HV circuit (410/410b) and the LV circuit (420) by way of corresponding capacitances (315/315b, 325) and substrate resistances $R_{SUB1}$ and $R_{SUB2}$. Considering an exemplary non-limiting case where the HV circuit (410) of FIG. 4A is subjected to 15 V and the LV circuit (420) of FIG. 4A is subjected to 0V, then the size of the capacitors (315, 325) of FIG. 4A under the HV/LV circuits (410, 420) of FIG. 4A divide the voltages (15V, 0V) such that the substrate surface regions (465, 475) are at potentials that can induce parasitic leakages in one or both of the HV and LV circuits (410, 420). Accordingly, following the CCB teachings of the present disclosure, values of one or more of the capacitors (315, 325) are modified such that the capacitive voltage divider between the HV and LV circuits (410, 420) provides potentials at the substrate surface regions (465, 475) that reduce, minimize or eliminate said induced parasitic leakages in both of the HV and LV circuits (410, 420), as shown in the exemplary embodiment depicted in FIG. 4B.

With further reference to FIG. 4B, the area of the top plate of the capacitor (315b) is increased with respect to the area of the top plate of the capacitor (315) of FIG. 4A by the addition of the region (410b) adjacent to the region (410) that forms the HV circuit. This in turn changes the capacitive voltage division described above to obtain the desired potentials at the surface regions (465b, 475). A person skilled in the art readily knows that the size of the capacitor (e.g. 465) can be adjusted, for example, by addition of silicon plates formed in the Si layer (105), or by addition of metal plates in areas adjacent to the BOX layer (102) created by first removing the Si layer (105). It follows that the region (410b) can comprise metal plates, silicon plates, a combination of metal and silicon plates and any other type of regions that can expand the top plate of capacitor. Moreover, as previously noted, either one or both of the capacitances (315, 325) of FIG. 4A can be adjusted based on the same concept so as to control the potentials at the regions (465, 475) to mitigate the effects of the back gate.

Considering a non-limiting exemplary case of the CCB in the absence of a substrate contact according to the present disclosure where the HV CCB capacitor (315) has a value of 2× and the LV CCB capacitor (325) has a value of 1×, and that the high voltage is 15 V and the low voltage is 0 V. For a transition of the high voltage, HV, from 0 V to 15 V in a time short compared to the RC time constants associated with resistances (340, 345) and capacitors (315b, 325), the regions comprising the bottom plates of capacitors (315b, 325) initially assume the same potential as the respective top plates of capacitors (315b, 325). Because of the additional resistance (340) between the capacitors (315b, 325), the potential in the region (465) of the substrate underneath the HV circuit (410) may be higher than 10 V, and even approaching 15 V depending on a value of the resistance (340). However, after a time period that is long compared to the RC time constants associated with resistances (340, 345) and capacitors (315b, 325), both bottom plate regions will assume a same potential and eventually discharge to the potential the substrate is held at through $V_{SUB}$ (ground). Therefore, if the high voltage, HV, transitions back to 0 V in a time frame substantially less than the RC time constants, then the capacitive coupling mechanism according to the present teachings can be effective as the potential of the substrate proximate the HV circuit can track the potential of the HV circuit, It should be noted that the same potential (equipotential) assumed by both bottom plate regions can be determined by the ratio of capacitors (315b) and (325). Since the HV CCB capacitor (315b) has 2× the value of LV CCB capacitor (325), it has twice the influence on the equipotential value. Therefore, the final equipotential value in this example is 10 volts, resulting in the potential difference across LV CCB capacitor (325) being 2× the potential difference across the HV CCB capacitor (315b). Choice of substrate potentials is understood by a person skilled in the art to be determined by threshold voltages of transistors of the HV and LV circuits (410, 420) and their sensitivity to back channel leakage. This non-limiting exemplary case simply shows how the substrate potential can be controlled by proper design of the current invention. In particular, the HV and LV circuits (410, 420) can be designed to provide desired values of the capacitors (315, 325), either effective capacitance values or ratios of the capacitances. Based on the teachings of the CCB according to the present disclosure, a person skilled in the art would know of many methods and techniques suitable for determining values of the capacitors (315, 325) so as to control voltages at the substrate surface regions (465, 475) to mitigate the effects of the back gate.

A person skilled in the art would understand that circuit regions (sub-circuits) or transistors of the circuits (410, 420) to which the high voltage or low voltage are applied may form a contiguous region of the silicon layer (105) isolated from other regions of the silicon layer (105), similar to a silicon island. Accordingly, the CCB of the present disclosure can be used to control voltages at surface regions (465, 475) of the substrate (201) under one or more silicon islands (410, 420) held at different island voltages based on capacitive division of the island voltages, by adjusting the areas of the one or more islands which determine capacitance values used in the capacitive division of the island voltages.

Figure 5A:
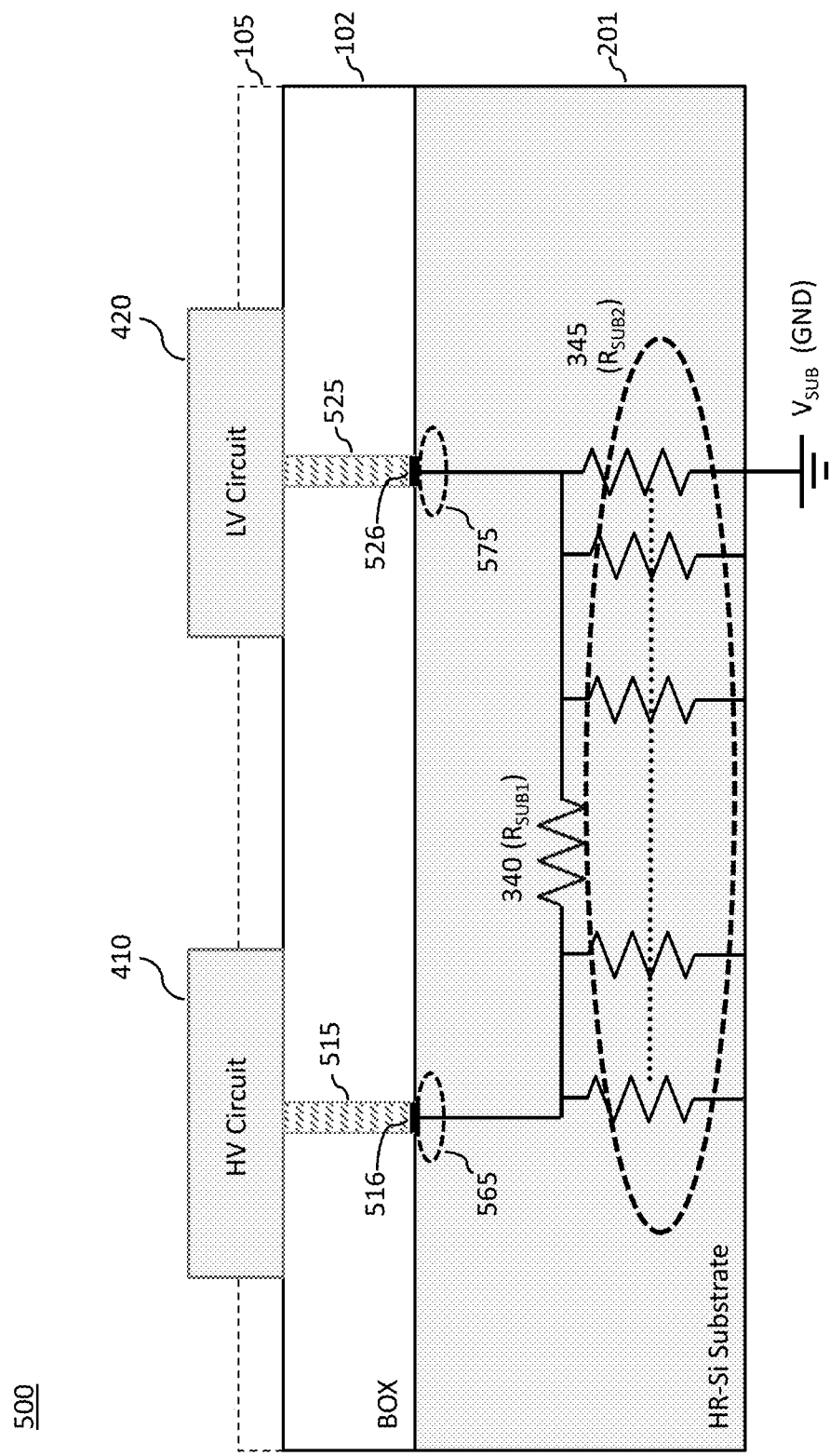
FIG. 5A shows an embodiment of the present disclosure referred to as Through BOX Contact, TBC, where a resistive coupling through the buried oxide (BOX) layer is formed by a through box contact that resistively couples a region of a circuit subjected to a high voltage to a surface region of the high resistivity silicon proximate the region of the circuit. The TBC contact according to the present disclosure holds a potential at said surface region of the high resistivity silicon substrate to a level substantially equal to the potential of said region of the circuit, thereby mitigating back gate effects affecting both the high voltage circuit and the low voltage circuit.

With further reference to the CCB embodiment of the present disclosure described above, in view of the capacitive-resistive network (e.g. (315, 325, 340, 345) of FIG. 4A) that controls potentials at the substrate surface regions (e.g. (465, 475) of FIG. 4A), a person skilled in the art would understand that such control can be time dependent as the capacitors (315, 325) eventually discharge through the resistances (345, 340). In an exemplary case where the high voltage of the HV circuit is a switching voltage, as described in the above referenced U.S. application Ser. No. 14/661,848 entitled "Level Shifter", which is herein incorporated by reference in its entirety, desired potentials at the substrate surface regions (465, 475) can be maintained assuming that a period of the switching voltage is smaller than an RC time constant associated with a voltage at the substrate surface region (465). If said period is large enough or if the high voltage is a DC voltage, then the desired potential at the substrate surface region (465) may not be maintained as a corresponding voltage at the substrate surface region (465) discharges through the resistances (340, 345). Therefore, the CCB embodiment of the present disclosure may be characterized as transient control of the potentials of the substrate surface regions (465, 475) with respect to the applied high and low voltages (to circuits (410, 420) formed in the silicon layer (105)). It follows that according to an embodiment of the present disclosure, a static control of the potentials of the substrate surface regions (465, 475) with respect to the applied high and low voltages is provided. Such static control according to the embodiment of the present disclosure is referred to as a Through BOX Contact, TBC, as shown in FIG. 5A, which uses through BOX contacts as known to person skilled in the art and described, for example, in the above referenced U.S. application Ser. No. 14/964,412 entitled "S-Contact for SOT", which is herein incorporated by reference in its entirety.

With further reference to the TBC embodiment of the present disclosure depicted in FIG. 5A, a through box contact, TBC (515), holds the potential at a surface of the substrate (565) under a region of the HV circuit (410) to a level substantially equal to the potential of the HV circuit (410) (that corresponds to the high voltage applied to the HV circuit). As described in more detail below, the TBC contact (515) is constructed in such a manner as to control a surface potential at the region (565) surrounding the TBC contact (515), while ensuring that any space charge region resulting from such contact is localized, thereby ensuring that the surface potential at the region (565) has a minimal effect on nearby regions (formed in the silicon layer (105)) of the HV circuit (410). As can be seen in FIG. 5A, the region (565) does not cover the entire region under the HV circuit (410), but rather a localized region surrounding the TBC contact (515).

As described above, potentials in the substrate can be spatially varying substrate potentials, as the localized substrate potential underneath the HV region can be different from the localized substrate potential underneath the LV region. The time scale going from the post transition of such spatially varying substrate potentials state (good for transistors) to approaching the equilibrium substrate potential (bad for transistors) is typically on the order of micro-seconds. One or more TBC contacts according the present disclosure can be used to maintain the substrate (201) in a spatially variable state with the potential difference between a transistor and local substrate maintained within acceptable limits, the transistor being a transistor sensitive to the back gate induced effects and the one or more TBC contacts being formed in close proximity of the transistor. Accordingly, TBC contacts can be selectively used for discrete transistors of the circuits (410, 420), or regions of the circuits (410, 420), that need protection against back gate induced effects.

Figure 5B:
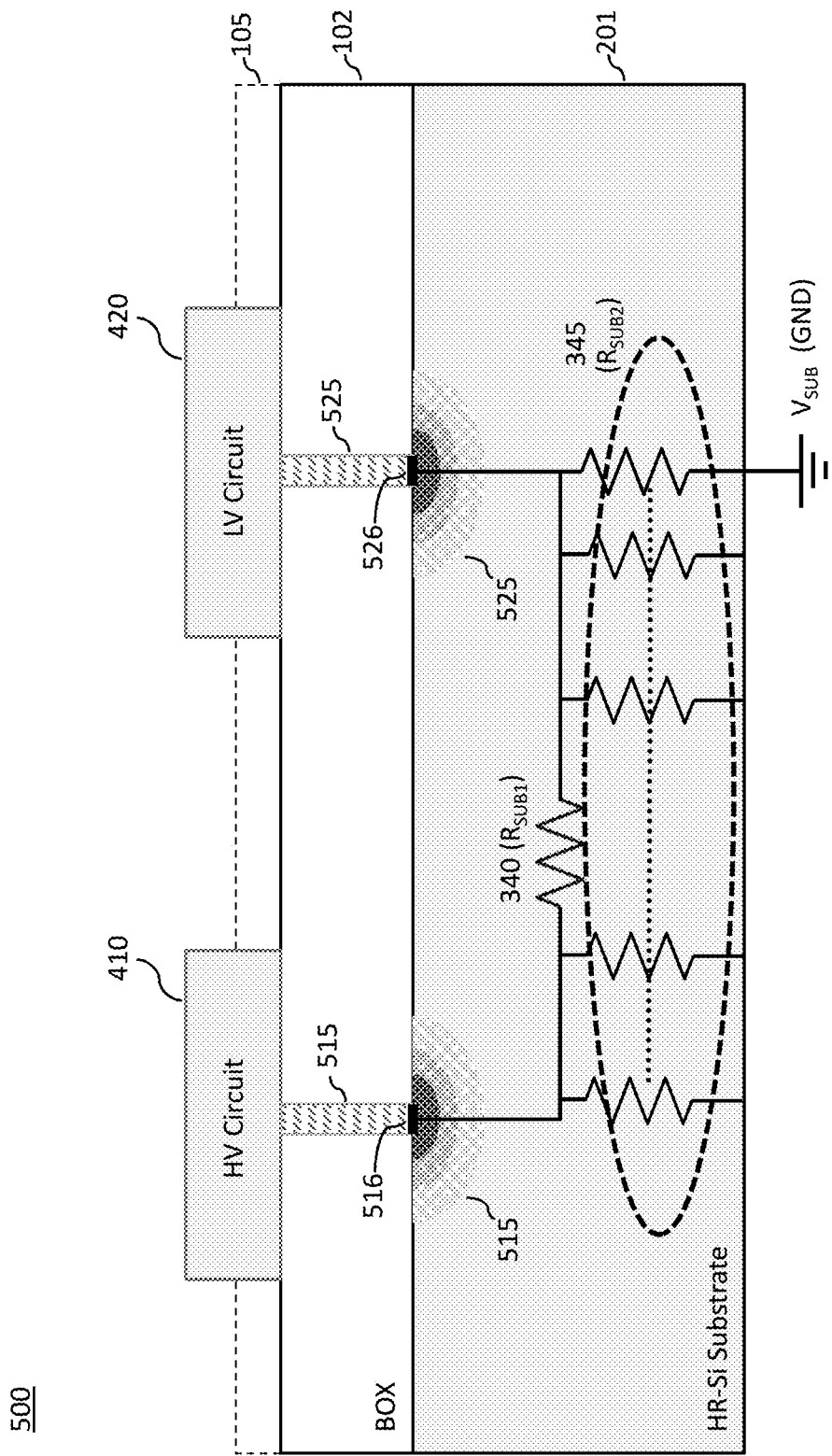
FIG. 5B shows space charges formed around an interface region between the TBC contacts of FIG. 5A and the high resistivity substrate.

As depicted in FIG. 5B, the TBC contact (515, 525) according to the present disclosure biases the substrate (201) to near the potential applied to the TBC contact (at the circuit level) and when placed near a transistor, it can help keep a region of the substrate (201) under the transistor near the potential applied to the TBC contact (515, 525). This effect can be seen in FIG. 5, in which the center of the space charge where the TBC (515, 525) makes contact is shown to be of lower density than those regions farther away from the center. The TBC contact (515, 525) forms a critical DC current path which can source or sink charge and thereby reduce the space charge density near its contact point. The TBC contact (515, 525) completes this current path along with substrate resistances ($R_{SUB1}$, $R_{SUB2}$) as shown in FIG. 5B. A person skilled in the art would understand that the resistance values are exemplary and can be designed to be substantially different to achieve different results. According to some exemplary embodiments of the present disclosure, such different results can be achieved by adding more or less TBC contacts to change an effective resistance. Key to understanding the TBC operation and its voltage division properties is recognizing the presence of a non-ohmic contact (e.g. (516, 526) between the TBC (515, 525) and the substrate (201) as described below.

Figure 5C:
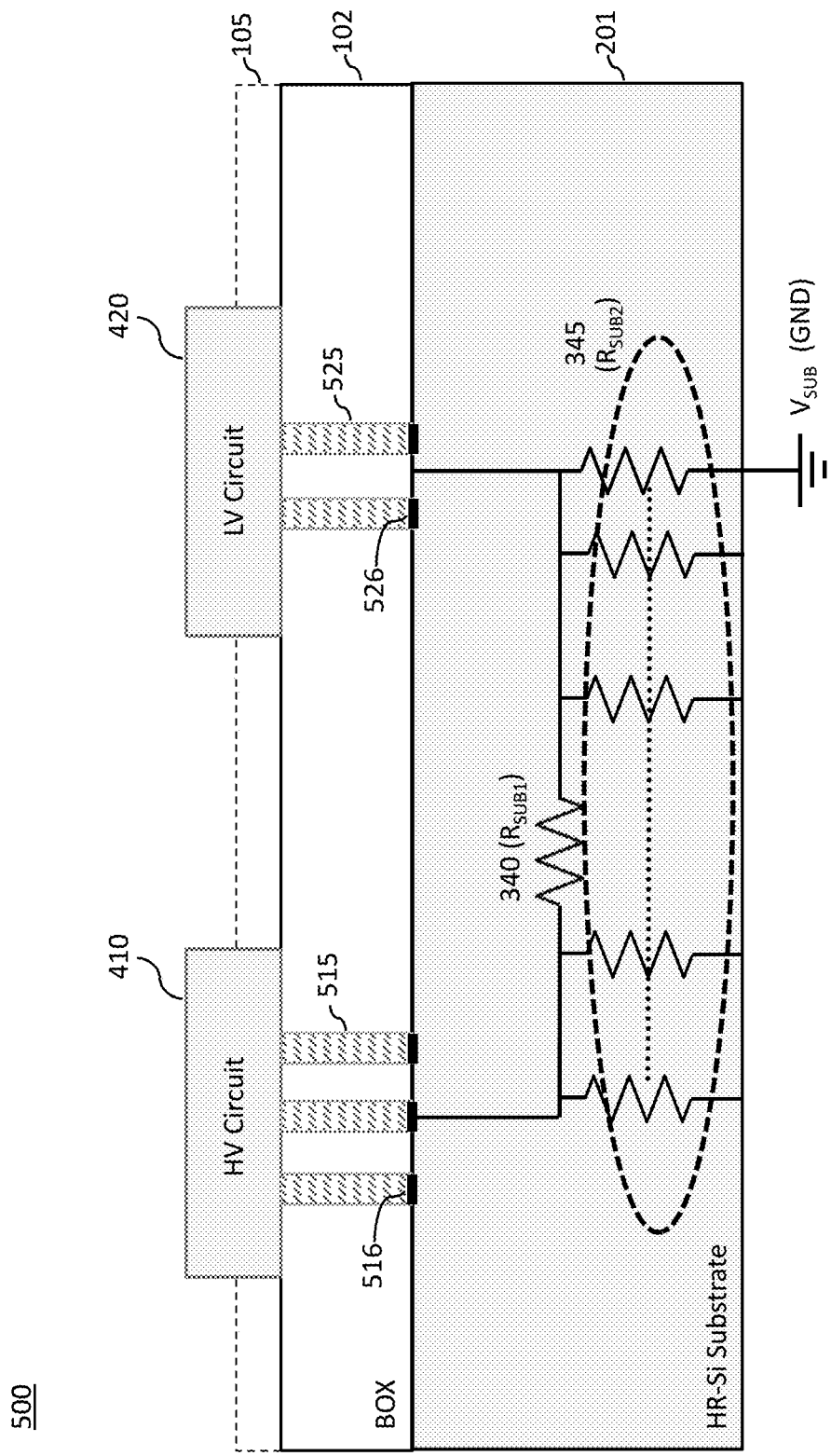
FIG. 5C shows an exemplary embodiment of the TBC contact of the present disclosure where several such contacts are used to protect different regions of a circuit from back gate induced effects.

As can be seen in FIG. 5B, the TBC contact (515, 525) is most effective close to its substrate contact (516, 526), but at distances farther away, the space charge region is stronger and thereby susceptible to inducing back gate leakage to corresponding regions of the circuits (410, 420). Obviously, as shown in FIG. 5C, additional TBC contacts (515, 525) can be designed to provide sufficient spatial screening to ensure all critical regions (circuits/transistors) in the HV circuit (410) are protected. A person skilled in the art would understand that many spatial arrangements of TBC contacts according to the present disclosure are possible, including the non-limiting exemplary cases of TBC arranged in the shape of rings and area arrays, among others. Moreover, a person skilled in the art would understand that circuit regions (sub-circuits) or transistors of the circuits (410, 420) to which the high voltage or low voltage are applied may form a contiguous region of the silicon layer (105) isolated from other regions of the silicon layer (105), similar to an island. Accordingly, the TBC contacts of the present disclosure can be used to resistively connect an island formed in the silicon layer (105) coupled to a high/low voltage to the substrate (201), through the insulating BOX layer (102). One or more such TBCs can be used for any given such island, and different islands formed in different (separate) regions of the silicon layer (105) can be fitted with one or more such TBCs.

It is important to note that a TBC biased negatively to the substrate potential injects electrons, creating a forward biased condition. Under strong forward bias, injected electrons may diffuse substantial distances and thereby reduce the effective resistance of nearby reverse biased TBCs. Injected electrons can travel hundreds of micrometers in typical substrates and lower the potential at the substrate interface, even in regions with more positively biased TBC's, including a ring or array of TBCs.

The TBC embodiment according to the present disclosure discussed above, with reference to FIGS. 5A-5C, require a relatively high resistivity substrate (201) to create separate localized surface regions (565, 575) of uniform and different potentials. As describe with reference to same figures, a desired spatial screening can be achieved by usage of additional TBC contact such as, for example, to maintain larger localized surface regions. According to an additional embodiment of the present disclosure, an N-type implant can be formed in the substrate to extend to surface regions of the substrate proximate circuits to be protected, as shown in FIG. 6A.

Figure 6A:
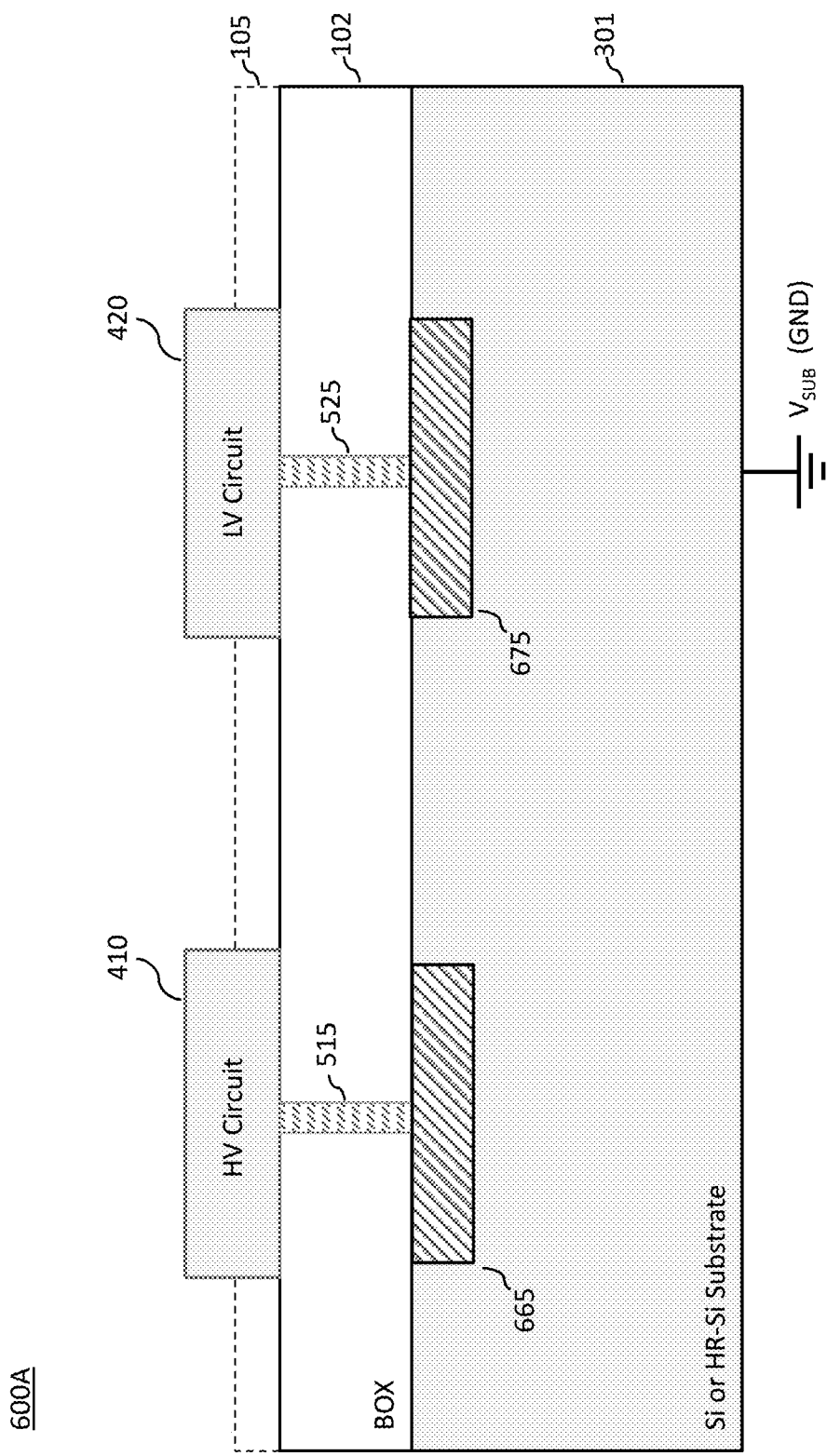
FIG. 6A shows an embodiment of the present disclosure, where a TBC is used to resistively couple a region of a circuit subjected to a high voltage to an N-type implant formed in a region of a substrate, not necessarily a high-resistivity substrate, proximate the region of the circuit. The N-type implant creates a PN-junction and allows a difference in potential between the N-type implant and the (P-type) substrate that can be high, therefore isolating the region of the substrate proximate the region of the circuit from a potential of the substrate. The N-type implant holds a uniform potential at a level substantially equal to the potential of said region of the circuit, thereby mitigating back gate effects affecting both the high voltage circuit and the low voltage circuit.
Figure 6B:
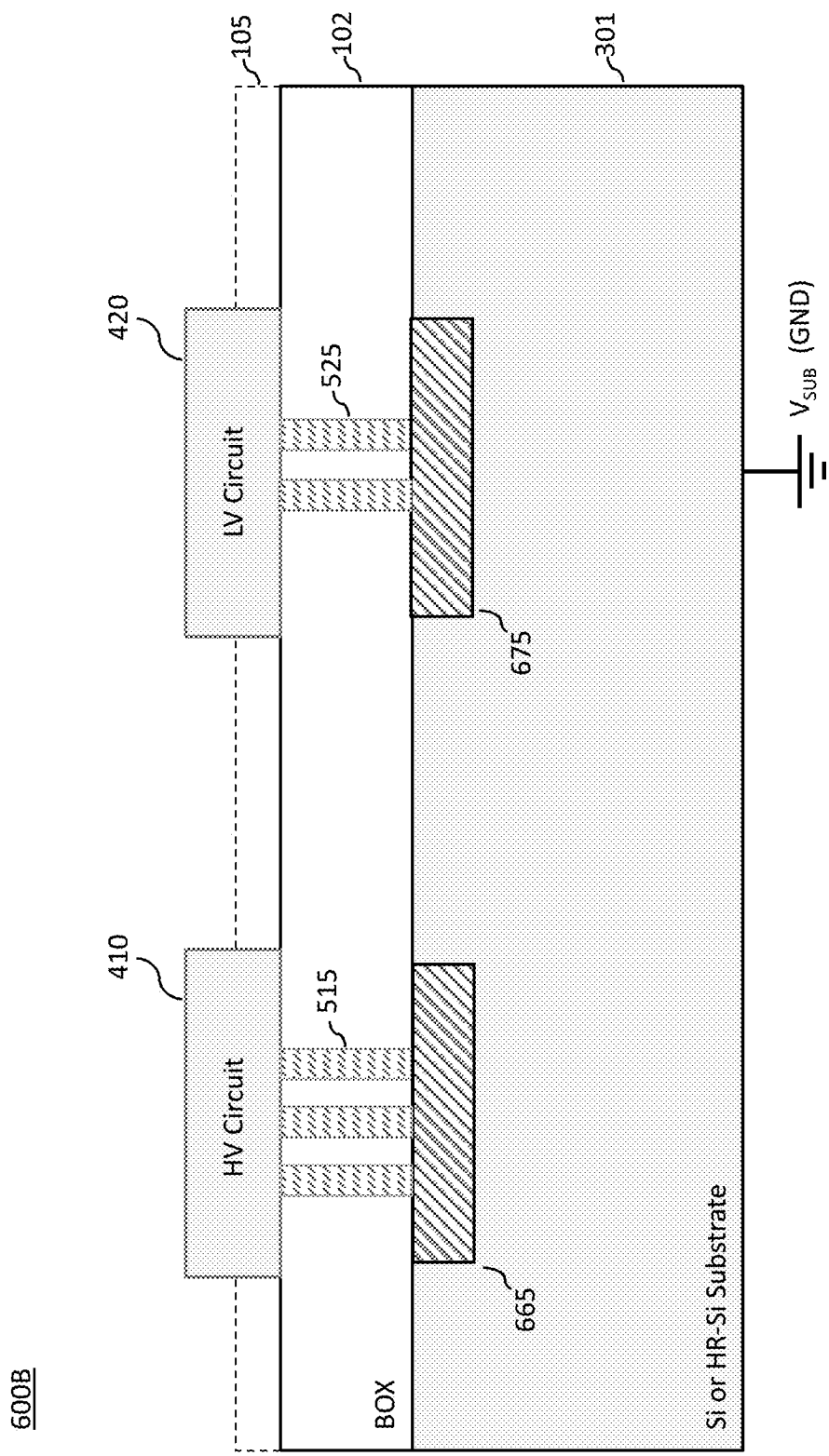
FIG. 6B shows an embodiment of the present disclosure, similar to the embodiment depicted in FIG. 6A, where more than one TBC is used to resistively couple regions of a circuit subjected to high voltages to the N-type implant.
Figure 6C:
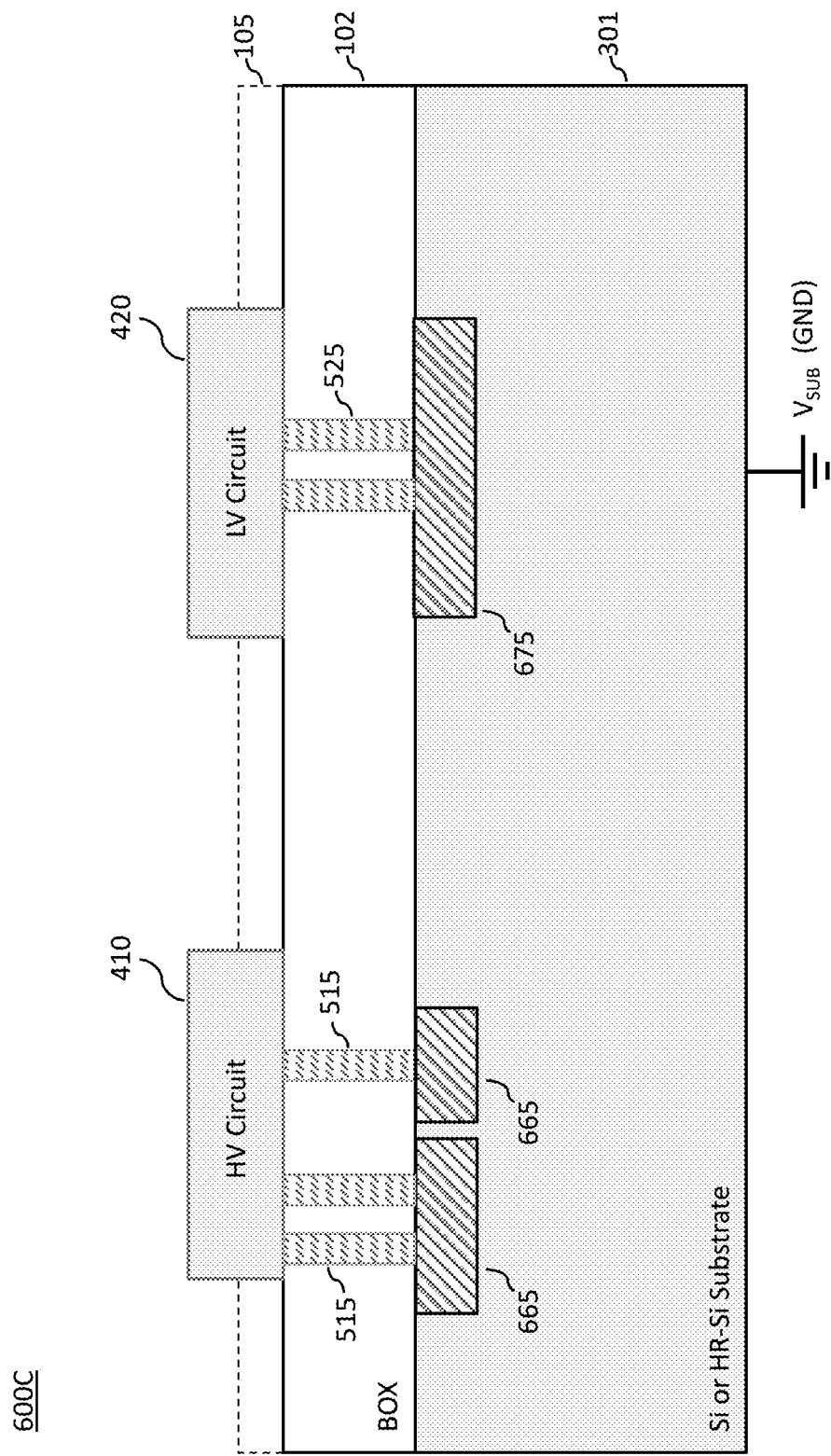
FIG. 6C shows an embodiment of the present disclosure, similar to the embodiment depicted in FIG. 6A and FIG. 6B, where more than one N-type implant is formed in regions of the substrate proximate a same circuit, where TBC contacts are used to resistively couple different regions of the circuit to the more than one N-type implant.

FIG. 6A shows an embodiment of the present disclosure, where a TBC (515, 525) is used to resistively couple a region of a circuit (410, 420) subjected to a high voltage to an N-type implant (665, 675) formed in a region of a substrate (301), not necessarily a high-resistivity substrate, proximate the region of the circuit (410, 420). The N-type implant (665, 675) creates a PN-junction and allows a difference in potential between the N-type implant (665, 675) and the (P-type)

substrate (301) that can be high (e.g. potential of the N-type implant 665, 676 is positive with respect to potential of the substrate), therefore isolating the region of the substrate proximate the region of the circuit from a potential of the substrate (301). The N-type implant (665, 675) holds a uniform potential at a level substantially equal to the potential of said region of the circuit, thereby mitigating back gate effects affecting both the high voltage circuit (410) and the low voltage circuit (420). FIG. 6A shows two such implants (665) and (675), each formed under a different circuit, (410) and (420) respectively, subjected to a different high voltage. Contrary to the TBC based embodiments of the present disclosure depicted in FIGS. 5A-5C, the present TBC based embodiment does not require a high resistivity substrate, as the substrate (301) of FIG. 6A can be either a low resistivity or a high resistivity substrate (each with or without a TR layer). Furthermore, as shown in FIG. 6B, several TBC contacts (515, 525) can be used to resistively couple different regions of a same circuit (410, 420) to a same N-type implant (665, 675). Based on the present teachings, a person skilled in the art would find other implementations examples, such as, for example, depicted in FIG. 6C, and therefore the exemplary embodiments presented herein should not be considered as limiting the scope of what the applicant considers to be the invention.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. The inventive concepts described above are particularly useful with an SOI-based fabrication process, and with fabrication processes having similar characteristics. Fabrication in CMOS on SOI enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A silicon on insulator (SOI) structure comprising:
  a silicon substrate configured to be coupled to a reference potential;
  a buried oxide (BOX) layer overlying the silicon substrate;
  a thin silicon layer overlying the BOX layer;
  a first circuit formed in a first silicon region of the thin silicon layer, the first circuit configured to be coupled to a first potential;
  a second circuit formed in a second silicon region of the thin silicon layer, the second circuit configured to be coupled to a second potential different from the first potential;
  at least one N-type implant formed in a region of the silicon substrate underlying a local silicon region of one of the first and the second silicon region of the silicon substrate, and comprising a surface region of the silicon substrate proximate the local silicon region; and
  at least one through BOX contact (TBC) resistively coupling the local silicon region to the at least one N-type implant,
  wherein:
  a potential difference between the first potential and the reference potential is equal to or larger than 10 V, and a potential difference between the second potential and the reference potential is equal to or smaller than 3 V,
  the local silicon region comprises one or more transistors sensitive to a back gate effect, and
  the TBC is configured to bias the N-type implant to a potential substantially equal to one of the first potential and the second potential coupled to the local silicon region, thereby reducing the back gate effect over the one or more transistors.

2. The silicon on insulator (SOI) structure of claim 1, wherein the silicon substrate is a high resistivity (HR-Si) substrate.

3. The silicon on insulator (SOI) structure of claim 1, wherein the at least one TBC comprises a plurality of TBCs resistively coupling the local silicon region to the at least one N-type implant.

4. The silicon on insulator (SOI) structure of claim 1, wherein the at least one TBC comprises a plurality of TBCs resistively coupling different local silicon regions of the one of the first and the second silicon regions to the at least on N-type implant.

5. The silicon on insulator (SOI) structure of claim 1, wherein the at least one TBC comprises a plurality of TBCs, wherein the at least one N-type implant comprises a plurality of N-type implants, and wherein the plurality of TBCs resistively couple local silicon regions of the one of the first and the second silicon regions to the plurality of N-type implants.

6. The silicon on insulator (SOI) structure of claim 1, further comprising an additional at least one N-type implant and an additional at least one TBC resistively coupling a local silicon region of the other of the first silicon region and the second silicon region to the additional at least one N-type implant.

7. A method for reducing a back gate effect in a silicon on insulator (SOI) structure formed on a silicon substrate, the method comprising:
    forming a first silicon region in a thin silicon layer of the SOI structure, the first silicon region configured to be coupled to a first voltage having a high level equal to or higher than 10 V;
    forming a second silicon region, isolated from the first silicon region, in the thin silicon layer, the second silicon region configured to be coupled to a second voltage having a high level equal to or lower than 3 V;
    forming at least one N-type implant formed in a region of the silicon substrate underlying a local silicon region of one of the first and the second silicon region of the silicon substrate, and comprising a surface region of the silicon substrate proximate the local silicon region, the local silicon region comprising one or more transistors sensitive to a back gate effect;
    forming at least one through BOX contact (TBC) that resistively couples the local silicon region to the at least one N-type implant;
    coupling the first voltage to the first silicon region and the second voltage to the second silicon region;
    coupling the silicon substrate to a reference potential;
    based on the forming and the coupling, biasing the N-type implant to a potential substantially equal to one of the first voltage and the second voltage, thereby reducing the back gate effect over the one or more transistors.

8. The method according to claim 7, wherein the silicon substrate is a high resistivity silicon (HR-Si) substrate.

* * * * *